(12) United States Patent
Yoshida et al.

(10) Patent No.: US 7,708,195 B2
(45) Date of Patent: May 4, 2010

(54) MEMORY CARD

(75) Inventors: Satoshi Yoshida, Tokyo (JP); Nagamasa Mizushima, Tokyo (JP); Shinsuke Asari, Tokyo (JP); Shigeo Kurakata, Tokyo (JP); Makoto Obata, Chiba (JP)

(73) Assignee: Renesas Technology Corp., Tokyo (JP)

( * ) Notice: Subject to any disclaimer, the term of this patent is extended or adjusted under 35 U.S.C. 154(b) by 855 days.

(21) Appl. No.: 11/508,243

(22) Filed: Aug. 23, 2006

(65) Prior Publication Data

US 2007/0045425 A1 Mar. 1, 2007

(30) Foreign Application Priority Data

Aug. 24, 2005 (JP) ............................. 2005-242568

(51) Int. Cl.
*G06K 5/00* (2006.01)
*G06K 19/06* (2006.01)
*G06K 7/06* (2006.01)

(52) U.S. Cl. ..................... 235/380; 235/492; 235/441

(58) Field of Classification Search .................. 235/380, 235/492, 441, 375, 382, 486; 365/185.33, 365/189.11, 221
See application file for complete search history.

(56) References Cited

U.S. PATENT DOCUMENTS

2002/0054240 A1* 5/2002 Sabe et al. ................... 348/571
2003/0202383 A1* 10/2003 Shiota et al. ............ 365/185.33
2004/0122984 A1* 6/2004 Oyama et al. .................... 710/1
2005/0162929 A1* 7/2005 Shiota et al. ............ 365/185.29
2007/0045425 A1* 3/2007 Yoshida et al. ............... 235/492
2007/0186033 A1* 8/2007 Shinagawa et al. ........... 711/103
2008/0049504 A1* 2/2008 Kasahara et al. ........ 365/185.09

FOREIGN PATENT DOCUMENTS

JP 2003-22216 1/2003

* cited by examiner

*Primary Examiner*—Thien M Le
(74) *Attorney, Agent, or Firm*—Mattingly & Malur, P.C.

(57) ABSTRACT

A memory card has external interface terminals, an interface controller connected to each of the terminals, a rewritable nonvolatile memory connected to the interface controller, and a data processor connected to the interface controller. The interface controller can perform an operation based on another command supplied from the outside in parallel with the operations of transferring a command for a data process supplied from the outside to the data processor and operating it. The interface controller has plural buffers and, after completely inputting the command for a data process from an outside to a first buffer of the plural buffers, allows data related to the other command supplied from the outside to be inputted to a second buffer of the plural buffers. The memory card can receive a command data and data to be processed subsequently from the outside without the need of waiting for the completion of the communication process between the data processor and the interface controller.

21 Claims, 33 Drawing Sheets

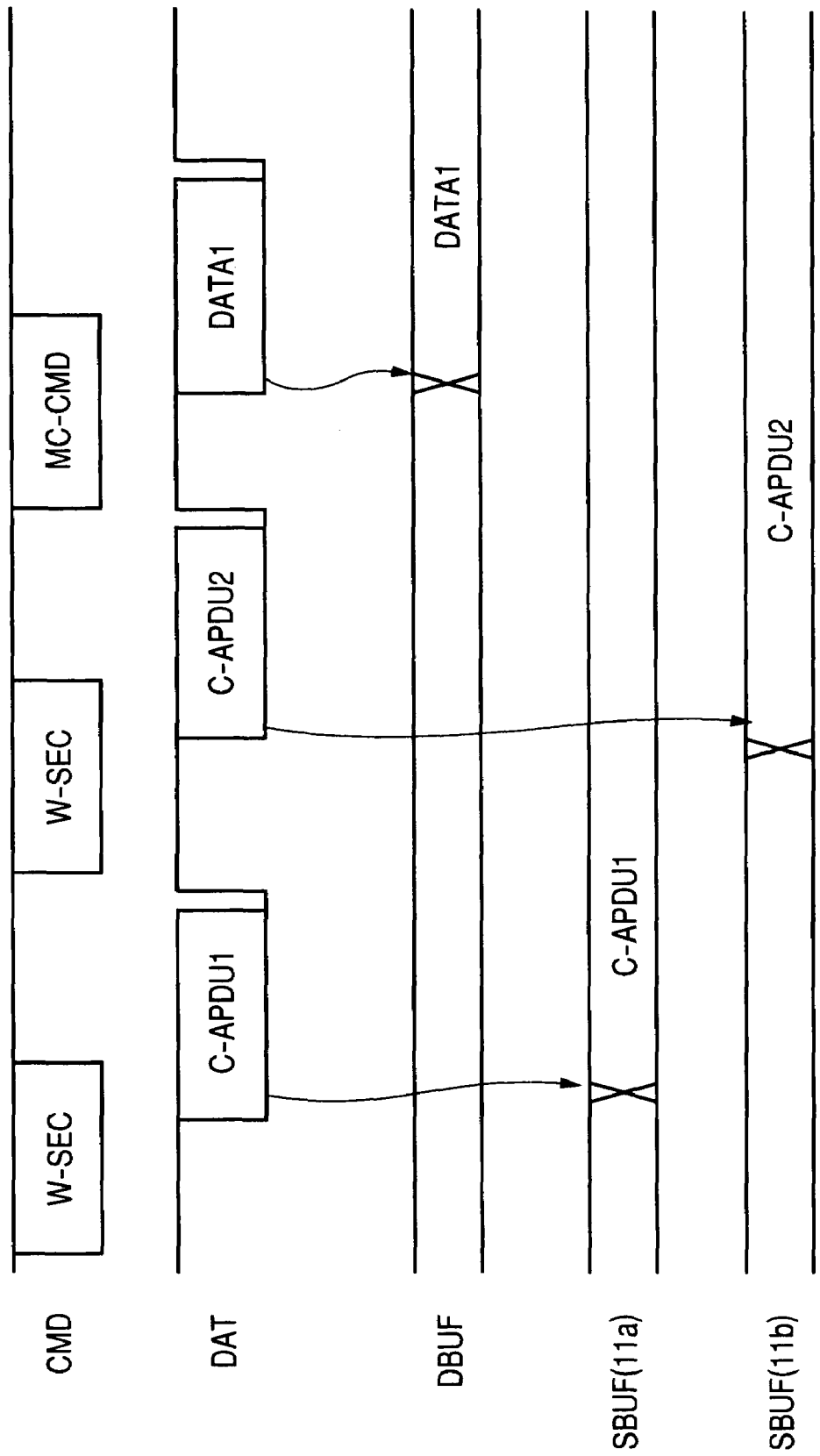

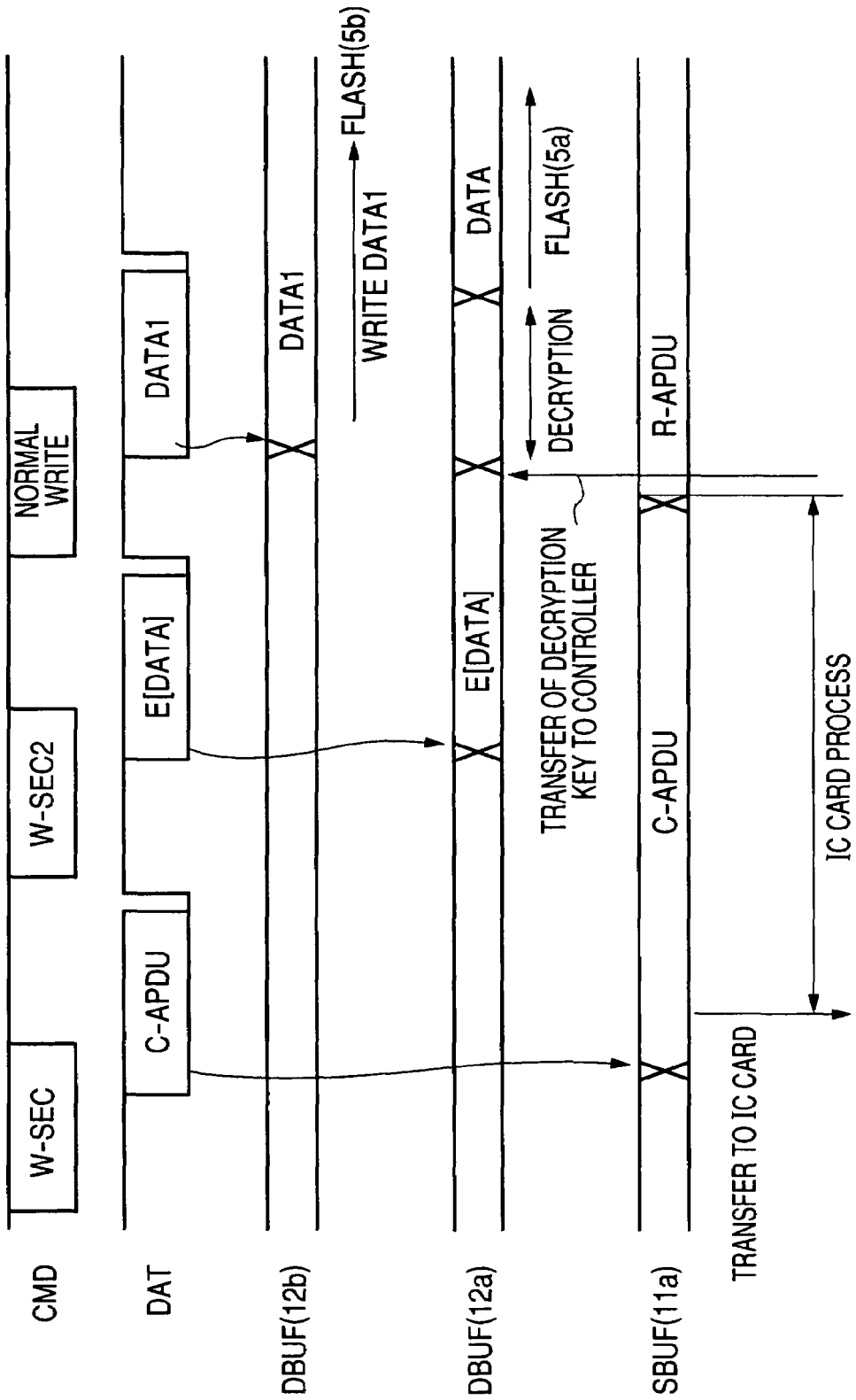

MEMORY CARD

CROSS-REFERENCE TO RELATED APPLICATION

The present application claims priority from Japanese patent application No. 2005-242568 filed on Aug. 24, 2005, the content of which is hereby incorporated by reference into this application.

BACKGROUND OF THE INVENTION

The present invention relates to a memory card having a security function performed by using a data processor and to a technology which is useful when applied to a memory card having, e.g., a microcomputer for IC card mounted thereon together with a flash memory or the like.

Each of Patent Document 1 and Patent Document 2 discloses a memory card with a security function which comprises a flash memory chip, a microcomputer chip for IC card, and a controller chip. The microcomputer for IC card performs a security process. The controller chip controls access to the flash memory chip and to the IC card chip and the like in response to a request from a host. And Patent Document 3 discloses a memory card having a plurality of buffer memories.

[Patent Document 1] Japanese Unexamined Patent Publication No. 2003-22216
[Patent Document 2] U.S. Pat. No. 6,669,487
[Patent Document 3] U.S. Pat. No. 5,592,415

SUMMARY OF THE INVENTION

Because the microcomputer chip for IC card inherently performs heavy-load data processes such as data encryption/decryption processes, an authentication process, and the like, when the memory card receives a command for IC card, the microcomputer chip may occasionally require a long time to perform a data process responding thereto. In such a situation, it has been considered to permit access to the flash memory chip during the data process performed by the microcomputer chip for IC card.

The present inventors have examined the structure and function of a buffer used to input/output data between the memory card and the outside when processing by the microcomputer chip for IC card is permitted. According to the result of the examination, in the case where one buffer is used for the storage of data related to the data process performed by the microcomputer chip for IC card and also for the storage of data for access to the flash memory chip, when the buffer receives data for the microcomputer chip for IC card, it cannot receive new data till the received data is transferred completely to the microcomputer chip for IC card. When the speed of communication between the microcomputer chip for IC card and the controller chip is low or when large-capacity data is transmitted, the communication time is long so that a waiting time therefor becomes unignorably long.

When the microcomputer for IC card and the controller are composed of different individual chips, the memory card can be implemented conveniently by using any of various microcomputer chips for IC card already certified by evaluation/certification organizations for the ISO/IEC 15408 as a standard for security evaluation. However, when a scheme for communication with the already certified microcomputer chip for IC card mentioned above is low in communication speed such as according to the standard ISO 7816 for IC card communication or the like or when large-capacity data is transmitted by using another peculiar interface, the unignorably long waiting time mentioned above becomes obvious in the communication between the microcomputer chip for IC card and the controller chip described above.

It is therefore an object of the invention to provide a memory card capable of receiving a command and data to be subsequently processed from the outside without waiting for the completion of a communication process between a data processor and an interface controller.

The above and other objects and novel features of the present invention will become apparent from the description of the present specification and the accompanying drawings.

A brief description will be given to the outline of the representative aspects of the present invention disclosed in the present application.

A memory card in a first aspect of the present invention comprises: external interface terminals; an interface controller connected to each of the external interface terminals; a rewritable nonvolatile memory (5) connected to the interface controller; and a data processor (6) connected to the interface controller. The interface controller is capable of performing, while transferring a command (C-APDU) for a data process supplied from the outside to the data processor and operating it, an operation based on another command (MC-CMD) supplied from the outside in parallel therewith. The interface controller comprises plural buffers (11, 12) and, after completely inputting the command for a data process supplied from an outside to a first buffer (11) of the plural buffers, the interface controller allows data related to the other command supplied from the outside to be inputted to the second buffer (12) of the plural buffers (FIG. 1, FIG. 6).

The arrangement described above not only allows the interface controller to perform the operation based on the other command supplied from the outside in parallel with the operation of the data processor based on the command for a data process supplied from the outside but also allows the interface controller to receive a command and data to be subsequently processed from the outside without waiting for the completion of the communication process for giving the command for a data process to the data processor. By composing the interface controller and the data processor of different individual chips, in particular, it becomes possible to implement the memory card by using, for the data processor, any of various microcomputer chips for IC card already certified by evaluation/certification organizations for the ISO/IEC 15408 as a standard for security evaluation. Since highly versatile standard interfaces, such as according to the ISO 7816, have been used for the already certified microcomputer chip for IC card, even when the speed of communication between the microcomputer for IC card and the interface controller described above is low, it is possible to suppress the occurrence of a situation in which the restoration of the memory card to a state capable of receiving the command and data to be subsequently processed from the outside is significantly delayed.

In a second aspect of the present invention, the interface controller uses the first and second buffers (11, 12) to interface with the outside via the external interface terminals. In the second aspect of the present invention, the interface controller allows a control operation for storing the data in the second buffer accompanied with the second command supplied from the outside and writing the stored data from the second buffer in the nonvolatile memory, after the microcomputer for IC card receives the first command for a data process supplied from the outside in the first buffer and before the microcomputer for IC card finishes the data process based on the first command for a data process. In the second aspect of the present invention, the interface controller also allows a control operation for storing the data read from the nonvolatile memory into the second buffer in response to third command supplied from the outside and outputting the stored data from the second buffer to the outside, after the microcomputer for IC card receives the first command for a data process supplied from the outside in the first buffer and before the microcomputer for IC card finishes the data process based on the first command for a data process.

In a third aspect of the present invention, the interface controller uses the second buffer to interface with the outside via the external interface terminals, transfers the command for a data process from the outside, which is used by the data processor for a data process, from the second buffer to the first buffer, and then transfers a result of the data process performed by the data processor from the first buffer to the second buffer.

For example, in the third aspect of the present invention, the interface controller allows a signal (DAT) indicative of an internal busy state to be outputted to the outside and releases the busy state in synchronization with a timing with which the command for a data process from the outside, which is used by the data processor for the data process, is transferred completely from the first buffer to the second buffer. By referencing the signal indicative of the busy state, a host device connected to the external interface terminals is allowed to easily recognize the state in which the memory card can receive the other command.

In the third aspect of the present invention, the interface controller allows a control operation for storing the data in the second buffer accompanied with the second command supplied from the outside and writing the stored data from the second buffer in the nonvolatile memory, after the data processor receives the first command for a data process supplied from the outside in the second buffer and transferring the stored first command to the first buffer and before the data processor finishes the data process based on the first command. In the third aspect of the present invention, the interface controller also allows a control operation for storing the data read from the nonvolatile memory into the second buffer in response to third command supplied from the outside and outputting the stored data from the second buffer to the outside, after the data processor receives the first command for a data process supplied from the outside in the second buffer and transferring the stored first command to the first buffer and before the data processor finishes the data process based on the first command.

In a fourth aspect of the present invention, each of the first and second buffers may be a predetermined specific buffer. Alternatively, in the plural buffers, buffers allocated to the first buffer and buffers allocated to the second buffer may also be interchangeable buffers (11C, 12C). In the latter case, the interface controller has a flag (FLGa) indicative of the allocation as the first buffer and a flag (FLGb) indicative of the allocation as the second buffer (FIG. 8).

In a fifth aspect of the present invention, the interface controller further comprises a host interface (10) and a microcomputer (15). The host interface gives an interrupt request to the microcomputer in response to the inputting of a command (W-SEC, R-SEC, MC-CMD). The microcomputer executes an interrupt process corresponding to a type of the command in response to the interrupt request. When the inputted command is accompanied by the first command (C-APDU) for a data process, the microcomputer instructs the data processor to execute the first command for a data process and performs a control operation for bringing itself into a low-power-consumption state under the condition that there is no another interrupt request during the execution of the first command for a data process. The data processor releases the low-power-consumption state of the microcomputer in synchronization with a timing with which the execution of the first command for a data process is ended (FIG. 10). This allows a contribution to lower power consumption In a sixth aspect of the present invention, when a result (R-APDU) of the data process in accordance with the first command for a data process includes an instruction to access the nonvolatile memory and when an access request based on the access instruction competes with an access request corresponding to an instruction to access the nonvolatile memory in accordance with second command, the interface controller mediates between the two access requests and gives an access right to either of them depending on which one of the access rights is issued earlier or later.

Alternatively, when a result of the data process in accordance with the first command for a data process includes an instruction to access the nonvolatile memory and when an access request based on the access instruction competes with an access request corresponding to an instruction to access the nonvolatile memory in accordance with second command, the interface controller mediates between the two access requests and gives an access right preferentially to the access request corresponding to the access instruction in accordance with the second command. This allows an instruction to perform a new command process to access the nonvolatile memory from the host to be preferentially followed.

In the third aspect of the present invention, when a result of the data process in accordance with the first command for a data process includes an instruction to access the nonvolatile memory and when an access request for transferring the result of the data process related to the access instruction from the first buffer to the second buffer competes with an access request corresponding to an instruction to access the nonvolatile memory in accordance with second command, the interface controller preferentially accepts the access request corresponding to the access instruction in accordance with the second command. This allows an instruction to perform a new command process to access the nonvolatile memory from the host to be preferentially followed.

In a seventh aspect of the present invention, the interface controller further comprises a first operation unit (22) capable of decrypting encrypted data supplied from the outside to the first buffer. At this time, the interface controller is capable of controlling an operation of using the second buffer based on a second command supplied from the outside, during a period that the first operation unit carries out an operation of decrypting the encrypted data supplied from the outside to the first buffer. The decryption by the first operation unit becomes necessary when the communication between the host and the interface controller is performed by using the encrypted data. At this time, the interface controller can perform an operation based on second command from the outside not only in parallel with the operation of the data processor but also in parallel with the decrypting operation using the first operation unit.

In an eighth aspect of the present invention, the interface controller further comprises a second operation unit (30) capable of decrypting encrypted data supplied from the data processor to the first buffer or encrypting data to be transferred from the first buffer to the data processor. At this time, the interface controller is capable of controlling an operation of using the second buffer based on a second command supplied from the outside, during a period that the second operation unit carries out an operation of performing decryption or encryption. The encryption/decryption process by the second operation unit becomes necessary when the communication between the interface controller and the data processor is performed by using the encrypted data. At this time, the interface controller can perform an operation based on second command from the outside not only in parallel with the operation of the data processor but also in parallel with the decrypting operation using the first operation unit or the second operation unit.

In a ninth aspect of the present invention, the nonvolatile memory includes plural nonvolatile memories, the data processor includes plural data processors, the first buffer of the interface controller includes plural first buffers, and the second buffer of the interface controller includes plural second buffers.

In a tenth aspect of the present invention, the data processor is a microcomputer for an IC card. In addition, the interface controller, the nonvolatile memory, and the data processor are individual semiconductor integrated circuits formed in semiconductor chips distinct from each other.

A memory card in an eleventh aspect of the present invention comprises: an interface controller chip connected to each of memory card interface terminals; a rewritable nonvolatile memory chip connected to the interface controller chip; and a data processor chip connected to the interface controller chip. The interface controller chip is capable of performing, while operating the data processor chip by giving data for control accompanying a first command supplied from the outside, an operation based on second command supplied from the outside in parallel therewith. At this time, the interface controller chip has first and second buffers and, after completely inputting the data for control supplied from the outside to the first buffer, allows data related to the second command supplied from the outside to be inputted to the second buffer (FIG. 1).

A memory card according to the eleventh aspect of the present invention comprises: an interface controller chip connected to each of memory card interface terminals; a rewritable nonvolatile memory chip connected to the interface controller chip; and a data processor chip connected to the interface controller chip. The interface controller chip is capable of performing, while operating the data processor chip by giving data for control accompanying a first command supplied from the outside, an operation based on second command supplied from the outside in parallel therewith. The interface controller chip has first and second buffers, uses the second buffer for communication with the outside, and, after completely inputting the data for control to the second buffer and completely transferring the data for control to the first buffer, allows data related to the second command supplied from the outside to be inputted to the second buffer (FIG. 6).

The following is the brief description of effects achievable by the representative aspects of the invention disclosed in the present application.

That is, the memory card according to the present invention is allowed to receive the command and data to be subsequently processed from the outside without waiting for the completion of the communication process between the data processor and the interface controller.

BRIEF DESCRIPTION OF THE DRAWINGS

FIG. 33 is an operational timing chart for parallel processing responding to plural write secure commands; and FIG. 34 is an operational timing chart for a process of writing secure data directly in the protected area in accordance with a direct secure command as one of standard memory card commands.

DESCRIPTION OF THE PREFERRED EMBODIMENTS

Memory Card

Figure 1:
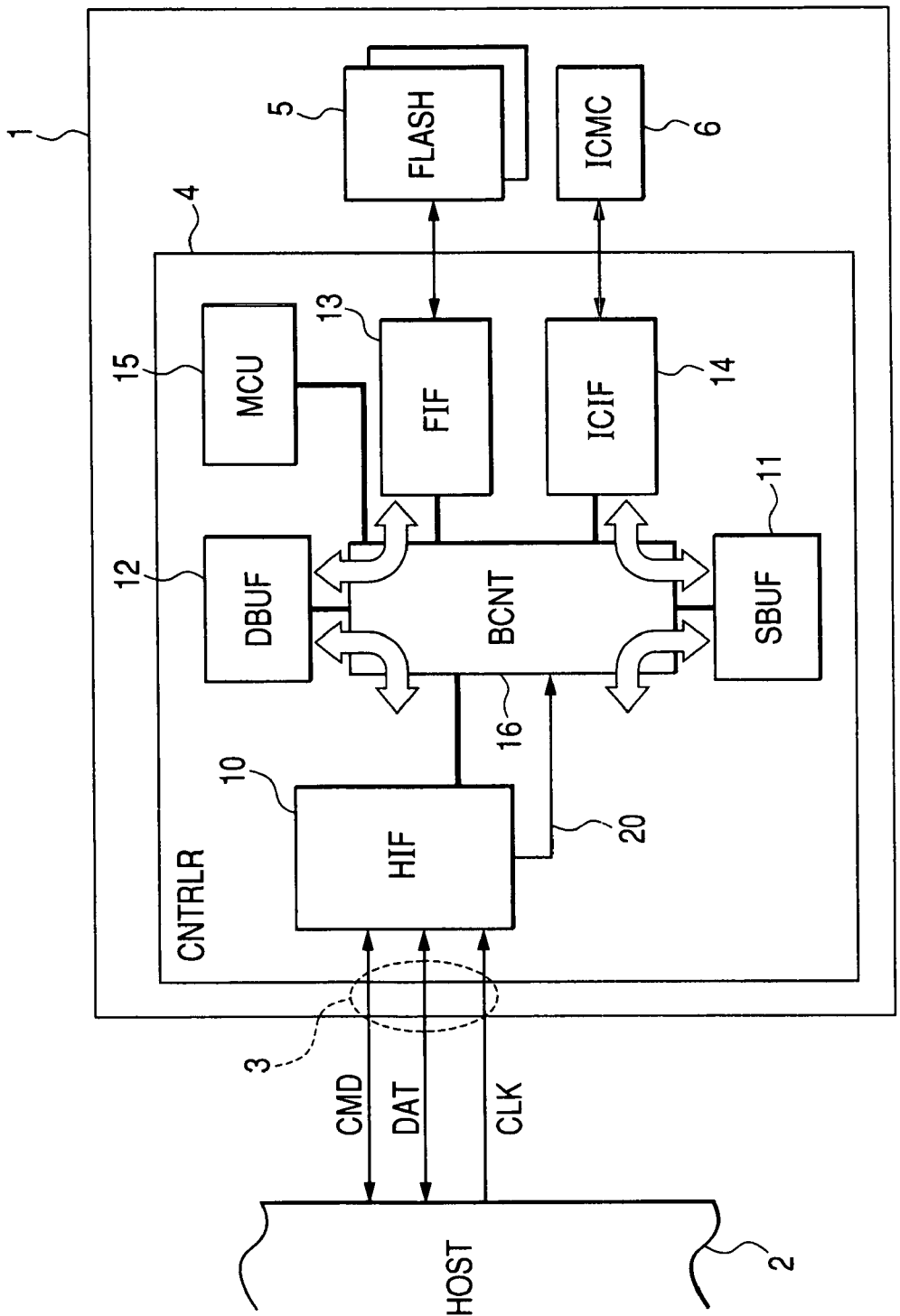
FIG. 1 is a block diagram illustrating a memory card to which the present invention has been applied.

FIG. 1 illustrates a memory card to which the present invention has been applied. The memory card 1 shown in FIG. 1 has a structure conforming to the specifications of Multi-MediaCard™ (which is the registered trademark of Infineon Technologies AG in Japan and hereinafter abbreviated as "MMC") or the SD card, though it is not particularly limited to the MMC or the SD card. The memory card 1 has not only the function of a memory card conforming to the MMC but also the function of performing a security process. The memory card 1 is connected to a host device 2 such as, e.g., a mobile phone, a personal data assistant (PDA), a personal computer, a music reproducing (and recording) device, a camera, a video camera, an automated teller machine, a public information terminal, or a banking terminal.

The memory card 1 has: external terminals 3 as external interface terminals; a controller chip (CNTRLR) 4 as an interface controller; one or more flash memory chips (FLASH) 5 as a nonvolatile memory; and an IC card microcomputer chip (ICCM) 6 as a data processor. Each of the chips used herein indicates a discrete semiconductor integrated circuit chip. The flash memory chip 5 is a memory chip using an electrically rewritable nonvolatile semiconductor memory as a storage medium and allows the reading and writing of data performed thereto in accordance with a flash memory command. As the external terminals 3, the memory card 1 has a clock input terminal CLK, a command I/O terminal CMD, and a data I/O terminal DAT. Besides, the memory card 1 also has a power supply terminal, a ground terminal, and the like, though they are not depicted.

The controller chip 4 is connected to each of the external terminals 3, the flash memory chip 5, and the IC card microcomputer chip (also referred to as the IC card chip) 6. The controller chip 4 is composed of: a host interface (HIF) 10; a secure buffer (SBUF) 11 as a first buffer; a data buffer (DBUF) 12 as a second buffer; a flash interface (FIF) 13; an IC card interface (ICIF) 14; a microcomputer (MCU) 15; and a buffer controller (BONT) 16.

The IC card chip 6 is a microcomputer chip which is usable even when buried in the plastic substrate of the IC card. For example, the external terminals, electric signal protocols, and commands of the IC card chip 6 conform to, e.g., the ISO/IEC 7816 standard. The IC card chip 6 comprises: a CPU (microcomputer) for performing, e.g., arithmetic operation processes; memories for storing data (including programs) such as a ROM (Read Only Memory), a RAM (Random Access Memory), and an EEPROM (Electrically Erasable Programmable ROM); an encryption coprocessor composing an encryptor for performing processes related to encryption/decryption; and a serial interface for transmitting and receiving data to and from the outside, though they are not particularly depicted. The serial interface provides connection between the IC card interface 14 and the IC card chip 6. The IC card interface 14 outputs an IC card command (C-APDU) to the IC card chip 6. The IC card chip 4 performs a security process in response to the IC card command inputted thereto and returns an IC card response (R-APDU) as the result of the security process to the IC card interface 14. The IC card response returned to the IC card interface 14 is internally transferred to the secure buffer 11 under the control of, e.g., the IC card interface 14.

For the IC card chip 6, a product already certified by an evaluation/certification organization for, e.g., the ISO/IEC 15408 as an international standard for security evaluation is preferably used. When an IC card having the function of performing a security process is actually used for electronic banking service or the like, the IC card is normally required to receive evaluation and certification by an evaluation/certification organization for the ISO/IEC 15408. When the memory card 1 is implemented by adding the security function to the MMC and actually used for electronic banking service or the like also, the memory card 1 is likewise required to receive evaluation and certification by an evaluation/certification organization for the ISO/IEC 15408. By having a structure which is internally provided with the IC card chip 6 already certified by the evaluation/certification organization and performs the security process using the IC card chip 6, the memory card 1 acquires the function to perform a security process. Accordingly, the memory card 1 can easily satisfy a security evaluation standard based on the ISO/IEC 15408 and reduce a development period for adding the function of performing the security process to the MMC. However, the present invention has no intention to exclude an IC card chip which is not a product already certified by an evaluation/certification organization for the ISO/IEC 15408 and may also use an IC card chip which has a security intensity required by a service provided by the IC card chip. For example, it is the IC card that the owner thereof can be provided services limited to the pre-charged amount of money.

Command interfacing for the memory card 1 is performed in conformity with the MMC interface specifications. For file access using the flash memory chip 5, standard memory card commands for the MMC are used. For the inputting/outputting of the IC card command (C-APDU), the IC card response (R-APDU) as the result of the security process performed by the IC card, and the like, a read secure command (CMD51) and a write secure command (CMD52), which are other than the standard memory card commands, are used. The protocols of commands such as the read secure command (CMD 51) and the write secure command (CMD 52) are the same as the read- and write-system commands of the standard memory card commands. The IC card command (C-APDU) is included in write data which accompanies the write secure command. The IC card response (R-APDU) is included in read data which is returned in response to the read secure command. The commands are inputted via the command I/O terminal CMD, while the IC card command (C-APDU) and the IC card response (R-APDU) are inputted/outputted via the data I/O terminal DAT. Information indicative of the number of data bytes has been added to the head of the IC card command and information indicative of the number of data bytes has been added to the head of the IC card response, though they are not shown in FIG. 2 and the like which will be described later.

The host interface 10 performs the inputting of a command and the inputting/outputting of data between the controller chip 4 and the host device 2. When a command and data are inputted, the host interface 10 holds the command in a command register (not shown). When the command is accompanied by data, the host interface 10 identifies the command and stores the data in the data buffer 12 or the secure buffer 11 by DMA transfer. The standard memory card command which instructs flash memory access has information (access target sector information) indicative of an access target sector together with the command code thereof. The access target sector information is also held together with the command code in the command register of the host interface 10. In the case where the write-system standard memory card command is held, the write data thereof is DMA transferred to the data buffer 12. In the case where the write secure command is held, the IC card command as the write data thereof is DMA transferred to the secure buffer 11. When the command is inputted, the host interface 10 further gives an interrupt request to the microcomputer 15. The microcomputer 15 to which the interrupt request has been given branches to the head address of a command process routine in accordance with the command by using the command code of the command latched by the command register as a vector. In the case where the flash-memory-access-system standard memory card command is held, the microcomputer 15 also fetches the access target sector information together with the command code thereof. The microcomputer 15 performs a control operation for accessing the flash memory chip 5 in accordance with the command processing routine and also performs a control operation for causing the IC card chip 6 to perform the security process or the like.

When write access is made to the flash memory chip, e.g., the microcomputer 15 internally transfers the write data from the data buffer 12 to the flash memory interface 13, while giving the access target sector information and an instruction to perform a write operation to the flash interface 13. As a result, the flash interface 13 gives a write sector address and the write data together with a flash write access command to the flash memory chip, thereby performing the writing of data. When read access is made to the flash memory chip, the microcomputer 15 gives an instruction to perform a read operation together with the access target sector information to the flash memory interface 13. As a result, the flash interface 13 gives a read sector address together with a flash read access command to the flash memory chip, thereby performing the reading of data, and internally transfers the read data to the data buffer 12. The read data that has been internally transferred is outputted by the buffer controller 16 from the data buffer 12 to the data I/O terminal DAT via the host interface 10.

In the case of responding to the write secure command, the microcomputer 15 gives an instruction to transfer the IC card command stored in the secure buffer 11 from the IC card interface 14 to the IC card chip. However, it is also possible for the ICIF 14 to automatically start transfer in response to a buffer indicating signal 20 from the host interface 10 without intervention of the microcomputer 15.

The IC card chip performs a data process responding to the received IC card command and returns the result of the process (IC card response) to the IC card interface 14. The IC card interface 14 transfers the IC card response to the secure buffer 11.

In the case of responding to the read secure command, the buffer controller 16 causes the IC card response stored in the secure buffer 11 to be outputted to the host device 2.

—Interleave Mode—

After supplying the IC card command from the secure buffer 11 to the IC card chip 6 to cause the IC card chip 6 to start the execution of the IC card command, the microcomputer 15 is allowed to perform a process in accordance with a standard memory card command such as the control of access to the flash memory chip 5 in parallel therewith without waiting for the completion of the execution. Specifically, after causing the IC card chip 6 to start the execution of the IC card command in response to the interrupt request from the host interface 10 resulting from the inputting of the secure command, the microcomputer 15 is allowed to respond to a subsequent interrupt request from the host interface 10 resulting from the inputting of the standard memory card command. In other words, multiple interrupts to the microcomputer 15 are permitted unless an interrupt mask is set. The subsequent interrupt request mentioned above becomes an interrupt which is permitted during the previous interrupt process based on the IC card command.

First Embodiment of Buffer Control

A description will be given to a first embodiment of the control of the secure buffer 11 and the data buffer 12 each described above. The host interface 10 determines the type of the command supplied from the host device 2 and gives the buffer indicating signal 20 in accordance with the result of the determination to the buffer controller 16. The buffer indicating signal 20 is a signal indicating which one of the secure buffer 11 and the data buffer 12 is to be used. In the case where the write secure control command is supplied, the buffer controller 16 stores the IC card command inputted together with the write secure command from the data I/O terminal DAT in the secure buffer 11. Upon completing the storage thereof in the secure buffer 11, the buffer controller 16 releases the notification of a busy state by causing the host interface 10 to shift the state of the data I/O terminal DAT from the LOW level to the HIGH level. Thereafter, when the host interface 10 notifies the buffer controller 16 of the buffer indicating signal 20 in response to the inputting of the standard memory card command for write access to the flash memory chip 5, the buffer controller 16 performs a control operation for storing the write data to the flash memory chip 5, which is supplied from the data I/O terminal DAT, in the data buffer 12. The storage of the write data is performed irrespective of whether or not the IC card command held in the secure buffer 11 has been transferred completely therefrom to the IC card chip 5 or whether or not the IC card response has been transferred completely from the IC card chip 6 to the secure buffer 11 through the execution of the IC card command. In the case where the read secure command is supplied, on the other hand, the buffer indicating signal 20 indicates the secure buffer 11 and the buffer controller 16 transfers the IC card response stored in the secure buffer 11 to the outside via the host interface 10.

After the storage of the IC card command in the secure buffer 11 is completed as described above, the buffer controller 16 is allowed to perform a control operation for storing access control data for the flash memory chip which accompanies the standard memory card command in the data buffer 12. A description will be given to an example of an efficient bus configuration which ensures the operation. Although the other circuit modules 10 to 15 are individually connected to the buffer controller 16 according to the illustration of FIG. 1, when the host interface (HIF) 10, the secure buffer (SBUF) 11 as the first buffer, the data buffer (DBUF) 12 as the second buffer, the flash interface (FIF) 13, the microcomputer (MCU) 15, and the buffer controller (BCNT) 16 are commonly connected to an internal bus by way of example, the IC card interface (ICIF) 14 is allowed to be connected selectively to the secure buffer or to the internal bus. In a normal state, the IC card interface (ICIF) 14 is connected to the internal bus such that it is controlled by the microcomputer 15. During the period from the time at which an instruction to transfer the IC card command or the IC card response to or from the secure buffer 11 is given from the microcomputer 15 to the IC card interface until the transfer is completed, the IC card interface (ICIF) 14 is selectively connected directly to the secure buffer 11. This can prevent data transfer between the secure buffer 11 and the IC card microcomputer 6 from competing with data transfer on the internal bus. It is also possible to optionally use a split transaction bus and thereby commonly connect all the circuit modules to the bus.

Figure 2:
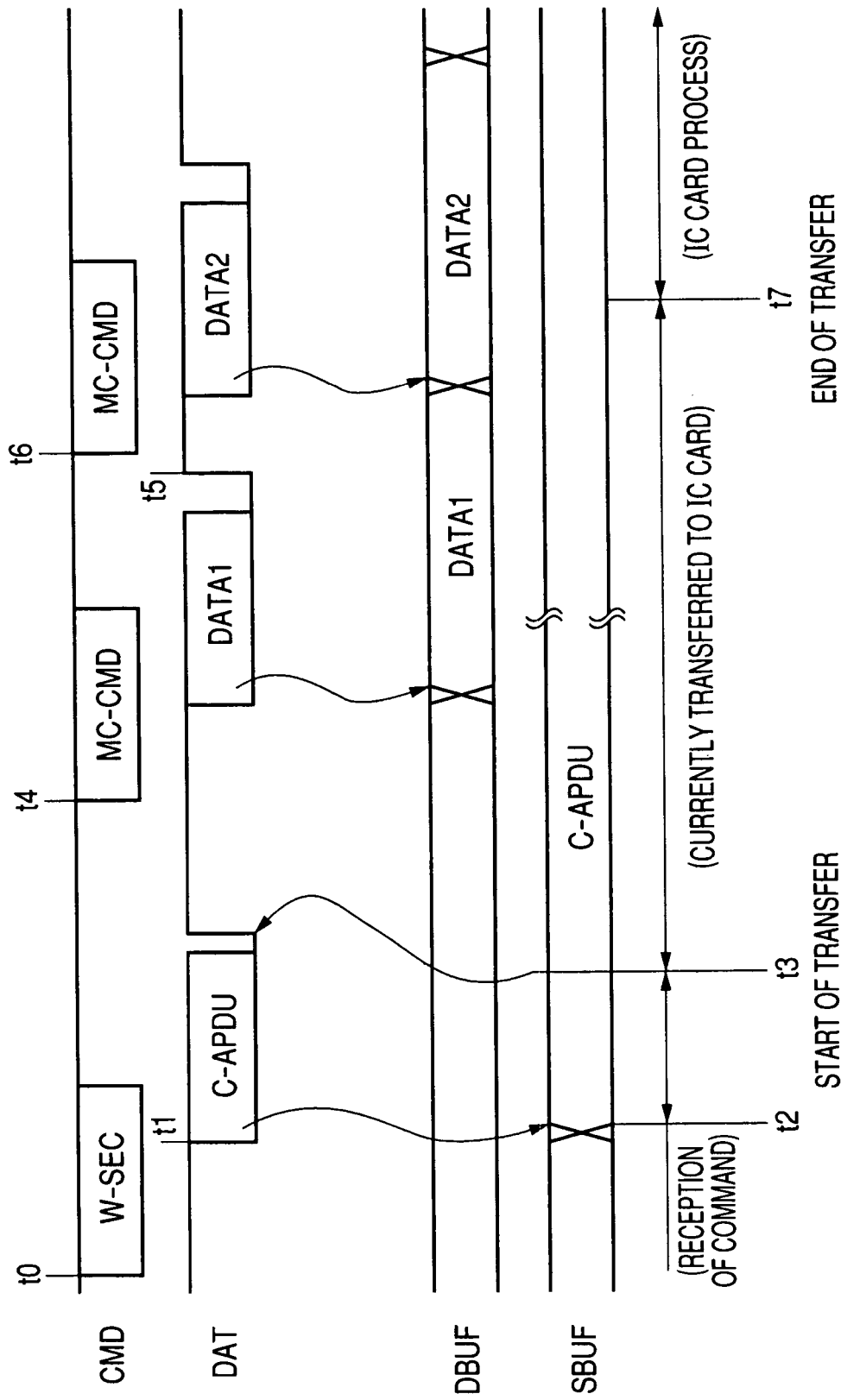
FIG. 2 is an operational timing chart when a write secure command and a standard memory card command which instructs flash write access are inputted in succession.

FIG. 2 illustrates a timing chart when the write secure command and the standard memory card command which instructs flash write access are inputted in succession. The write secure command (W-SEC) is inputted to the command terminal CMD (time t0) and the IC card command (IC-APUD) is inputted to the data I/O terminal DAT (time t1). The buffer controller 16 starts the storage of the IC card command in the secure buffer 11 indicated by the buffer indicating signal 20 (time t2). The microcomputer 15 to which an interrupt request resulting from the inputting of the write secure command has been issued follows an interrupt process in accordance with the interrupt factor so that it waits for the completion of the storage of the IC card command in the secure buffer 11 and gives, to the IC card interface 14, an instruction to transfer the IC card command from the secure buffer 11 to the IC card chip 6 (time t3). The data I/O terminal DAT is held at the LOW level during the period from the completion of the inputting of the IC card command IC-APDU to the time t3. A LOW-level output from the data I/O terminal DAT notifies the host device 2 of a busy state. The period of the busy state is used for a process in which the microcomputer 15 fetches the command code in the command register and determines the interrupt factor in response to the interrupt request and instructs the IC card interface 14 to transfer the IC card command from the secure buffer 11 to the IC card chip 6 based on the determined interrupt factor. In the case where there is a dedicated signal path for performing such an interrupt response process, the data I/O terminal DAT may be shifted to the HIGH level simultaneously with the completion of the inputting of the IC card command IC-APDU.

From the time t3 onward, the transfer of the IC card command from the secure buffer 11 to the IC card chip 6 is started and, when the busy state of the controller chip 4 is released, the controller chip 4 is allowed to receive the standard memory card command from the host device 2. When the standard memory command (MC-CMD) which instructs flash write access is supplied at the time t4, the buffer controller 16 stores the subsequent flash write data (DATA1) in the data buffer 12 indicated by the buffer indicating signal 20. The microcomputer 15 to which an interrupt request resulting from the inputting of the standard memory card command has been issued gives, to the flash memory interface 13, an instruction to write-access the flash write data stored in the data buffer 12 so that the flash memory chip 5 is accessed in accordance with the instruction. After the busy state is released at the time t5 also, the controller chip 4 is likewise allowed to receive the standard memory card command from the host device 2. When the standard memory card command (MC-CMD) which instructs write access is supplied at the time t6, the buffer controller 16 stores the subsequent flash write data (DATA2) in the data buffer 12 indicated by the buffer indicating signal 20. When the transfer of the IC card command (IC-APDU) to the IC card chip 6 is completed at the time t7 during the storage of the data in progress, the IC card chip 6 starts the execution of the transferred IC card command. During the execution of the IC card command by the IC card chip 6 also, the transfer of the flash write data (DATA2) to the data buffer 12 is continued. The microcomputer 15 to which the interrupt request resulting from the inputting of the standard memory card command has been issued gives, to the flash memory interface 13, an instruction to write-access the flash write data (DATA2) stored in the data buffer 12 from the time t8 onward so that the flash memory chip 5 is accessed in accordance with the instruction.

From the time t3 onward, the controller chip 4 is allowed to receive the standard memory card command and execute it during the transfer of the IC card command from the secure buffer 11 to the IC card chip 6 and during the execution of the transferred IC card command. When it is considered that a low-speed serial interface is mostly used for the connection between the IC card interface 14 and the IC card chip 6, the transfer of the IC card command requires a plenty of time and the secure process in accordance with the IC card command also involves a long process time for arithmetic operations such as the decryption of encrypted data and authentication. Even under such circumstances, the controller chip 4 is allowed to receive and execute the standard memory card command during the long process time so that the host device 2 is kept from waiting for a long time till the access request to the flash memory chip 5 is permitted.

Figure 3:
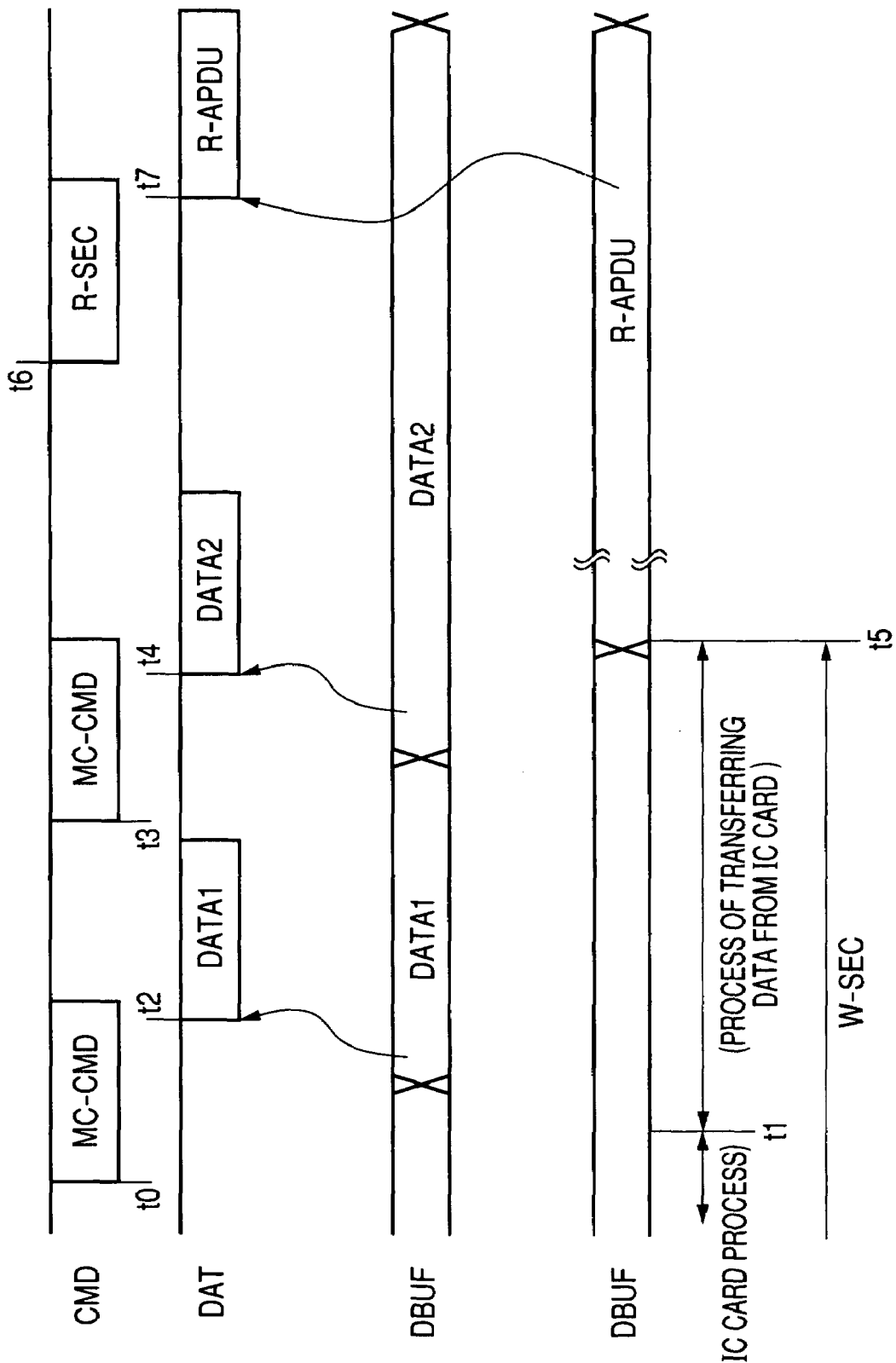
FIG. 3 is an operational timing chart when a read secure command and a standard memory card command which instructs flash read access are inputted in succession.

FIG. 3 illustrates a timing chart when the read secure command and the standard memory card command which instructs a flash read operation are inputted in succession. At the time t0, the standard memory card command which instructs flash read access is supplied to the command terminal CMD. The microcomputer 15 responding to the interrupt request resulting from the command read-accesses the flash memory chip 5 and causes the read data (DATA1) to be stored in the data buffer 12. The read data (DATA1) stored in the data buffer 12 is outputted by the buffer controller 16 from the data I/O terminal DAT (time t2). Likewise, the standard memory card command which instructs flash read access is supplied to the command terminal CMD at the time t03. The microcomputer 15 responding to the interrupt request resulting from the command read-accesses the flash memory chip 5 and causes the read data (DATA2) to be stored in the data buffer 12. The read data (DATA2) stored in the data buffer 12 is outputted by the buffer controller 16 from the data I/O terminal DAT (time t4).

Meanwhile, the IC card chip 6 is executing the IC card command given by the write secure command (W-SEC) and ends the IC card command process at, e.g., the time t1. The IC card response (R-APDU) obtained as a result of the IC card command process is internally transferred by the IC card interface 14 to the secure buffer 11. The internal transfer is ended at the time t5, whereby the process in accordance with the write secure command is completed. When a read secure command (R-SEC) is inputted from the command terminal CMD at the time t6, the buffer controller 16 causes the IC card response held by the secure buffer 11 to be outputted from the data I/O terminal DATA to the outside via the host interface 10 (time t7).

A description will be given to flash read after the secure write with reference to FIG. 2. A command which instructs flash read access is supplied as the standard memory card command at the time t4. After flash read data is read from the flash memory to the data buffer 12, the flash read data is outputted from the data I/O terminal DAT to the host device 2.

A description will be given to secure read after the flash write with reference to FIG. 3. A command which instructs flash write access is supplied as the standard memory card command at the time t0. At the time t2, flash write data is inputted from the data I/O terminal DAT and stored in the data buffer 12. At the time at which the storage of the flash write data in the data buffer 12 is completed, when the IC card chip 6 has already completed the execution of the IC card command, it is also possible to input the read secure command from the command terminal CMD and output the IC card response stored in the secure buffer 11 from the data I/O terminal DAT to the host device 2 in parallel with the release of the busy state in the controller chip 4 and with the storage of the flash write data in the flash memory. Alternatively, it is also possible to maintain the busy state in the controller chip 4 till the completion of the storage of the flash write data in the flash memory, input the read secure command from the command terminal CMD after the release of the busy state in the controller chip 4, and output the IC card response stored in the secure buffer 11 from the data I/O terminal DAT to the host device 2.

Figure 4:
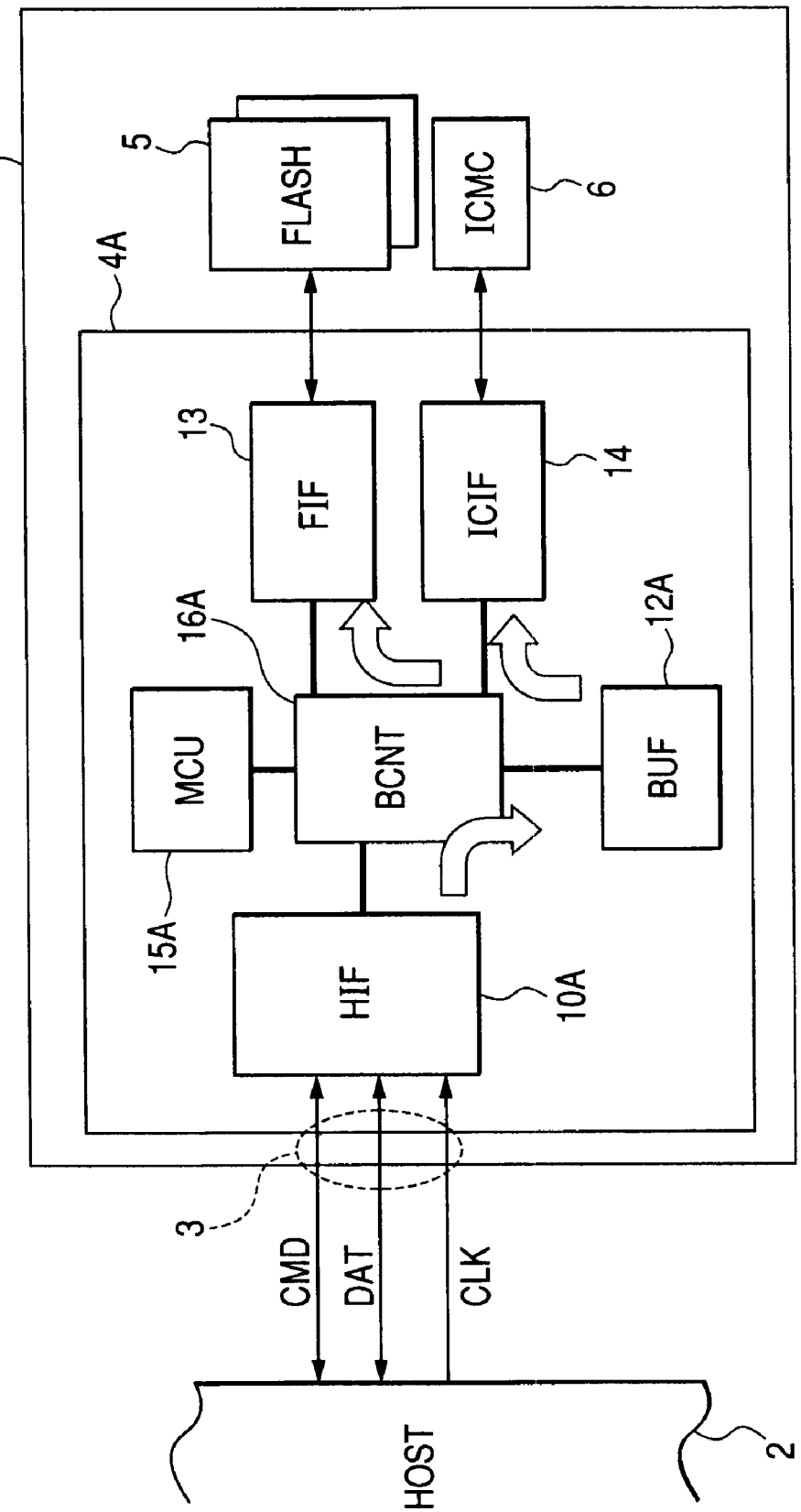
FIG. 4 is a block diagram illustrating a memory card according to a comparative example of the memory card of FIG. 1.

FIG. 4 illustrates a memory card 1A according to a comparative example of the memory card of FIG. 1. Compared with the memory card 1 described above, the memory card 1A has a simplified buffer function but has a structure which allows maximal use of the interleave mode to compensate for the simplified buffer function. Specifically, the memory card 1A does not have the data buffer 12 and the secure buffer 11 distinct from each other but uses one common buffer (BUF) 12A. A buffer controller 16A sequentially stores data sets supplied from the data I/O terminal DAT in the buffer 12A. When write data is stored in the buffer 12A, a host interface 10A cannot perform a new input/output operation via the data I/O terminal DAT till the transfer of the write data to the flash memory chip 5 via the flash interface 13 is completed. Likewise, when the IC card command is stored in the buffer 12A, the host interface 10A cannot perform a new input/output operation via the data I/O terminal DAT till the transfer of the IC card command to the IC card chip 6 via the IC card interface 14 is completed. A new input from the command terminal CMD or from the data I/o terminal DAT is permitted herein by releasing the busy state under the condition that the transfer of the write data or the IC card data (IC card command, IC card response) stored in the buffer 12A to the destination is completed.

Figure 5:
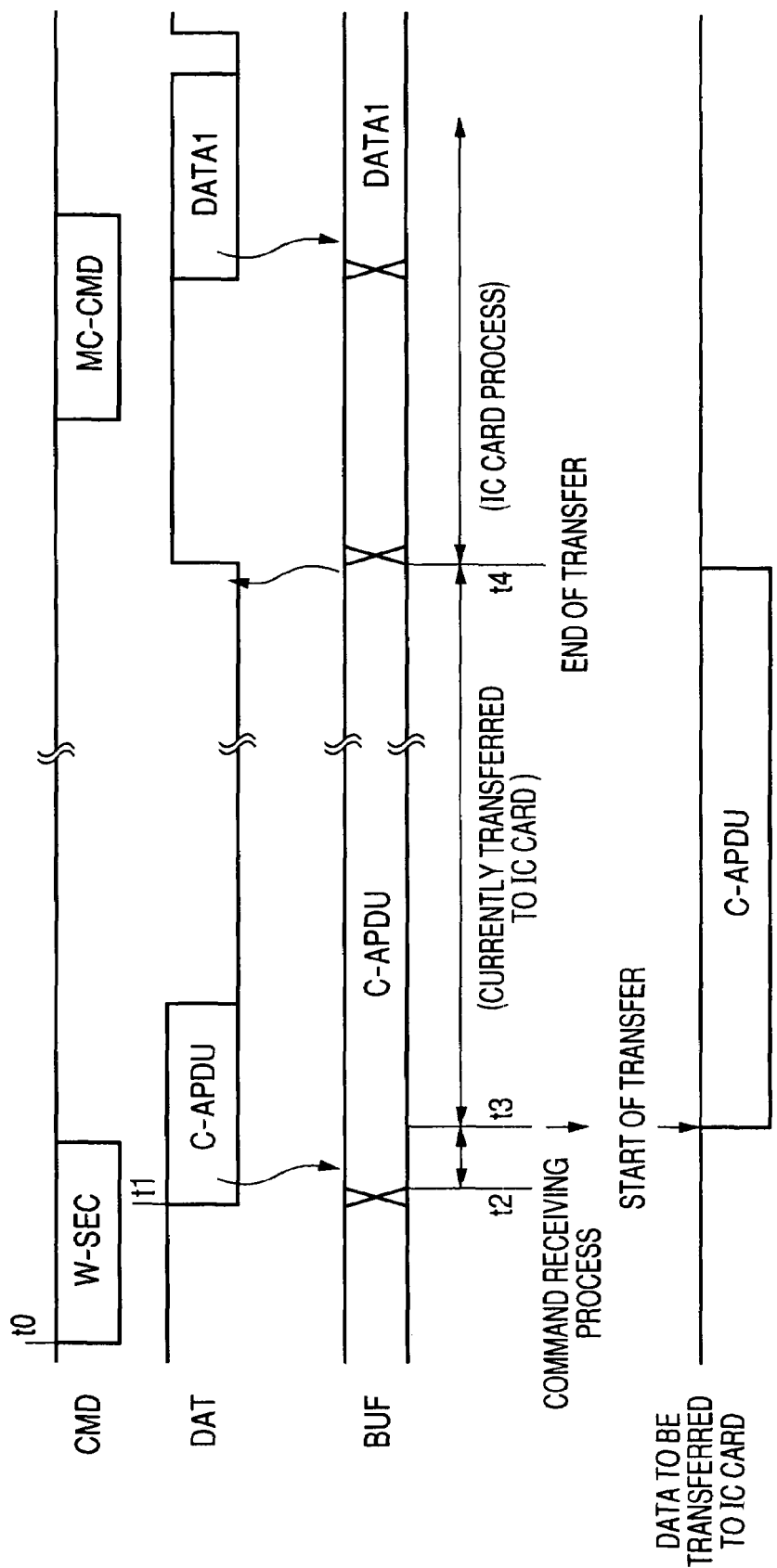
FIG. 5 is a timing chart showing a timing for releasing a busy state in the memory card of FIG. 4.

FIG. 5 shows the timing for releasing the busy state in the memory card 1A of FIG. 4. The write secure command (W-SEC) is inputted to the command terminal CMD (time t0) and the IC card command (IC-APDU) is inputted to the data I/O terminal DAT (time t1). The buffer controller 16A starts the storage of the IC card command in the buffer 12A (time t2). A microcomputer 15A to which an interrupt request resulting from the inputting of the write secure command has been issued gives, to an IC card interface 14A, an instruction to transfer the IC card command from the buffer 12A to the IC card chip 6 in accordance with the interrupt factor (time t3) and the transfer is ended at the time t4. While the transfer is ended, the data I/O terminal DAT is shifted to the LOW level and the host device 2 is notified of the busy state. In synchronization with the ending of the transfer at the time t3, the output from the data I/O terminal DAT is shifted to the HIGH level so that the busy state is released. When the busy state in a controller chip 4A is released, the controller chip 4A is allowed to receive the standard memory card command from the host device 2. From the time t3 onward, the IC card chip 6 executes the IC card command. When the standard memory card command (MC-CMD) which instructs flash write access is supplied in parallel therewith at the time t4, the buffer controller 16A stores the subsequent flash write data (DATA1) in the buffer 12A. The microcomputer 15A to which an interrupt request resulting from the inputting of the standard memory card command has been issued gives, to the flash memory interface 13, an instruction to write-access the flash write data stored in the buffer and the flash memory chip 5 is accessed in accordance with the instruction. As is obvious from the comparison between FIGS. 2 and 5, the controller chip 4A is allowed to receive the standard memory card command only after waiting till the time t7 in FIG. 2. In the structure comprising only the single buffer 12A, the busy state is released in synchronization with the timing with which the transfer of the data held previously in the buffer 12A to the destination is completed.

Second Embodiment of Buffer Control

Figure 6:
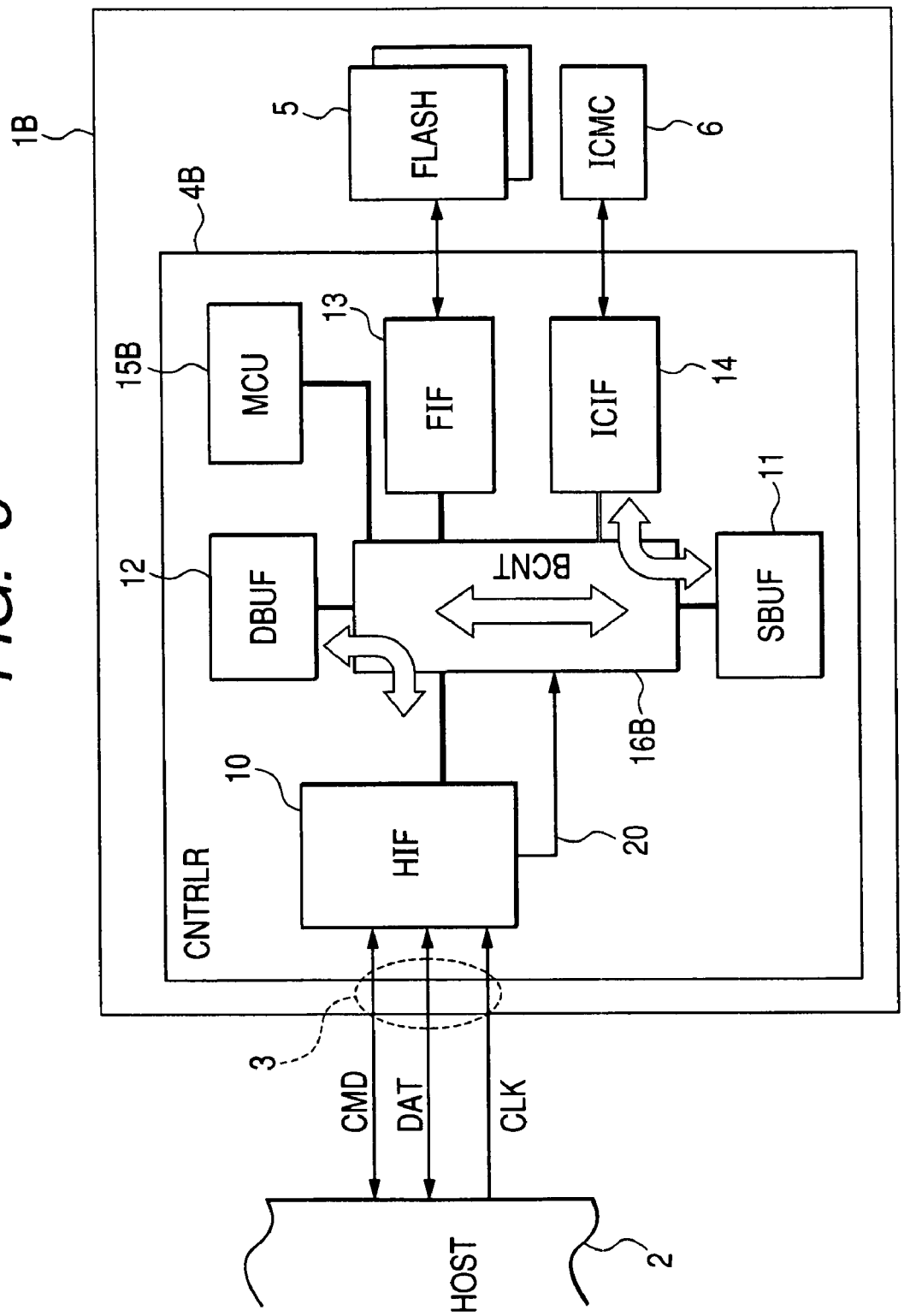
FIG. 6 is a block diagram illustrating a memory card to which a second embodiment of buffer control has been applied.

A description will be given to a second embodiment of the control of the secure buffer 11 and the data buffer 12. FIG. 6 shows a memory card 1B to which the second embodiment of buffer control has been applied. The second embodiment of buffer control is different from the first embodiment of buffer control of FIG. 1 in the following point. That is, a buffer controller 16B uses the data buffer 12 described above for interfacing with the host device 2 via the external interface terminals 3 described above, internally transfers the IC card command to be supplied to the IC card chip 6 described above from the data buffer 12 to the secure buffer 11, and transfers the IC card response received by the security buffer 11 from the IC card interface 14 to the data buffer 12.

For example, the host interface 10 determines the type of the command supplied from the host device 2 and gives the buffer indicating signal 20 in accordance with the result of the determination to the buffer controller 16B. The buffer controller 16B stores any data inputted together with the command from the data I/O terminal DAT first in the buffer 12. Then, the data buffer controller 16B follows the buffer indicating signal 20 and, when the inputted command is the write secure command, transfers the IC card command stored in the data buffer 12 to the secure buffer 11. When the storage of the IC card command in the secure buffer 11 is completed, the buffer controller 16B causes the host interface 10 to shift the state at the data I/O terminal DAT from the LOW level to the HIGH level and thereby releases the notification of the busy state. Thereafter, when the host interface 10 notifies the buffer controller 16B of the buffer indicating signal 20 in response to the inputting of the standard memory card command for write-access the flash memory chip 5, the buffer controller 16 performs a control operation for storing the write data which is supplied from the data I/O terminal DAT in the data buffer 12 and does not perform transfer to the secure buffer. In the case where the inputted command is the read secure command, on the other hand, the buffer indicating signal 20 indicates the secure buffer 11 so that the buffer controller 16 internally transfers the IC card response stored in the secure buffer 11 to the data buffer 12 and outputs it from the data buffer 12 to the outside via the host interface 10. As for the other part of the structure, it is the same as shown in FIG. 1 so that the detailed description thereof will be omitted.

Figure 7:
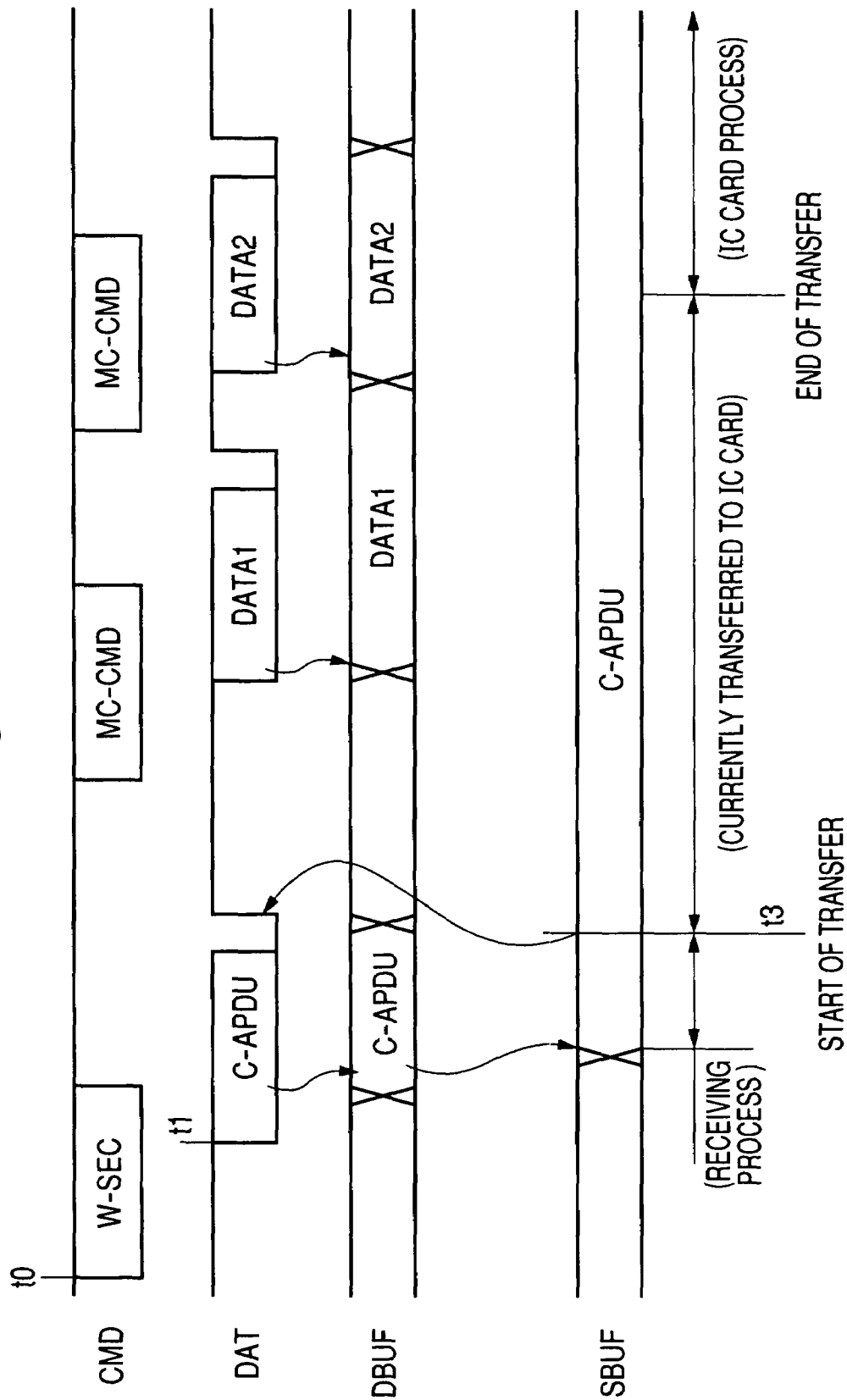
FIG. 7 is an operational timing chart when a write secure command and a standard memory card command which instructs flash write access are inputted in succession.

FIG. 7 illustrates a timing chart when the write secure command and the standard memory card command which instructs flash write access are inputted in succession. The write secure command (W-SEC) is inputted to the command terminal CMD (time t0) and the IC card command (IC-APDU) is inputted to the data I/O terminal DAT (time t1). The buffer controller 16B stores the IC card command in the data buffer 12 and starts the internal transfer of the IC card command from the data buffer 12 to the secure buffer 11 (time t2). The microcomputer 15 to which an interrupt request resulting from the inputting of the write secure command has been issued follows an interrupt process in accordance with the interrupt factor so that it waits for the completion of the transfer of the IC card command to the secure buffer 11 and gives, to the IC card interface 14, an instruction to transfer the IC card command from the secure buffer 11 to the IC card chip 6 (time t3).

In the second embodiment of buffer control, the time period from the time t1 to the time t3 is slightly longer than in FIG. 2, but the structure for data transfer control is simpler since the data buffer 12 exists as only one target of data transfer control between the buffer controller 16B and the host interface 10. Since mere inter-memory transfer control is sufficient to implement the transfer between the data buffer 12 and the secure buffer 11, particularly complicated transfer control is not necessary.

Third Embodiment of Buffer Control

Figure 8:
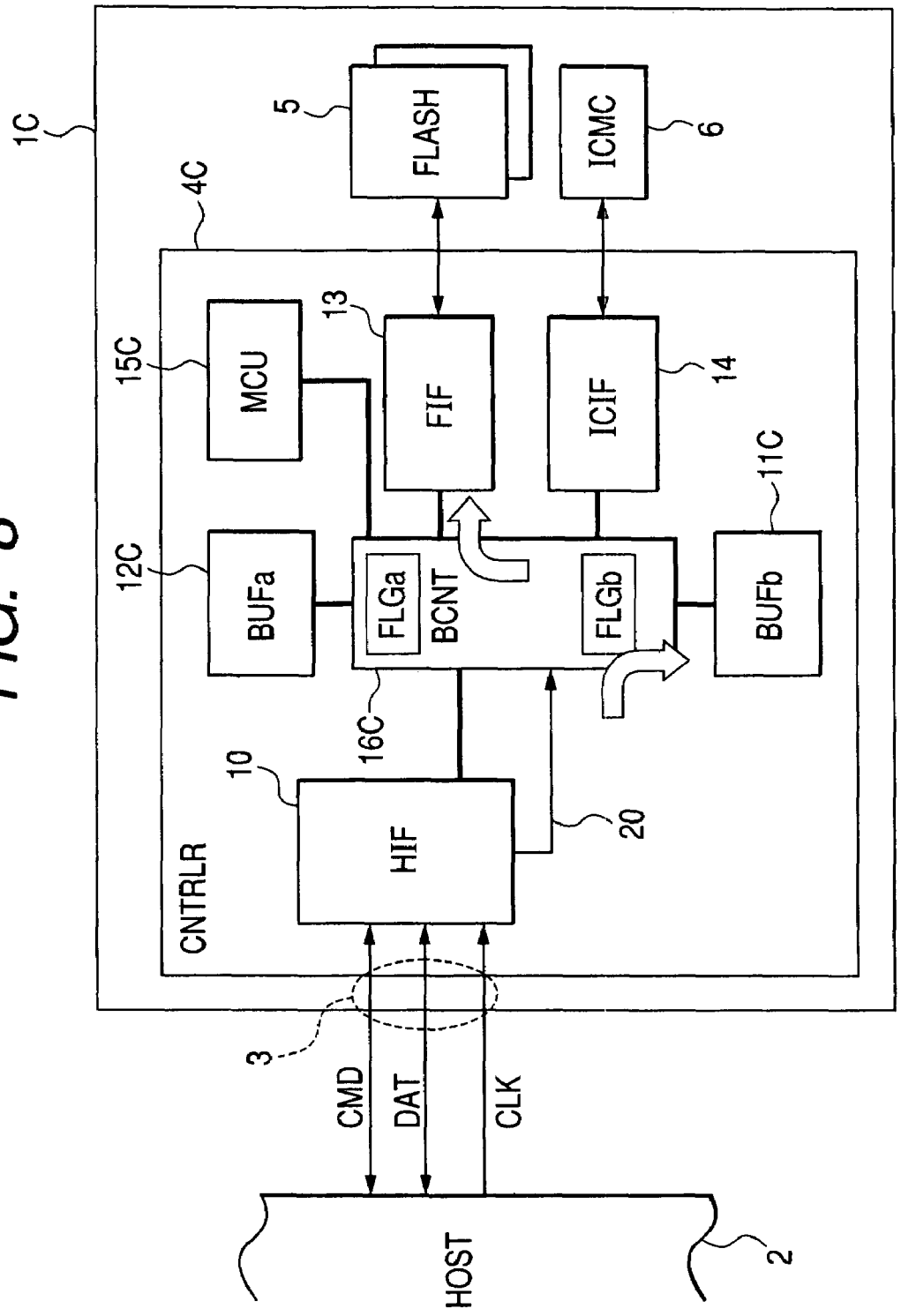
FIG. 8 is a block diagram of a memory card to which a third embodiment of buffer control has been applied.

A description will be given to a third embodiment of the control of the secure buffer 11 and the data buffer 12. FIG. 8 shows a memory card 1C to which the third embodiment of buffer control has been applied. The third embodiment of buffer control is different from the first embodiment of buffer control of FIG. 1 in the following point. That is, in the embodiments of buffer control described thus far, each of the data buffer 12 and the secure buffer 11 is a predetermined specific buffer. In FIG. 8, by contrast, two buffers 11C and 12C can be interchangeably allocated to the data buffer and to the secure buffer. At this time, a buffer controller 16C has a flag FLGb showing which one of the data buffer and the secure buffer the buffer 11C as one of the two buffers is allocated to and a flag FLGa showing which one of the data buffer and the secure buffer the buffer 12C as the other of the two buffers is allocated to. Each of the flags FLGa and FLGb has a secure buffer flag bit and a data buffer flag bit distinct from each other, though they are not particularly limited, so that the corresponding bit is set in accordance with the content of allocation. Allocation control is performed by the buffer controller 16C. For example, when both of the buffers 11c and 12C are unoccupied, the buffer 12C as one of the two buffers is preferentially used and the secure buffer flag bit or data buffer flag bit of the flag FLGa is set in accordance with the use purpose thereof. The use purpose is determined by the buffer controller 16C through the reference to the value of the buffer indicating signal 20. This is because the buffer indicating signal 20 is controlled to have different values when the secure command is inputted and when the standard memory card command is inputted. When one of the buffers 11C and 12C is in use, the unoccupied buffer is similarly used. When each of the two buffers is allocated to the secure buffer for the IC card process, the process in accordance with the standard memory card command significantly stagnates, which is also inconvenient in terms of processing the secure data. Therefore, the buffer controller 16C is inhibited from allocating each of the buffers 11C and 12C to the secure buffer.

Figure 9:
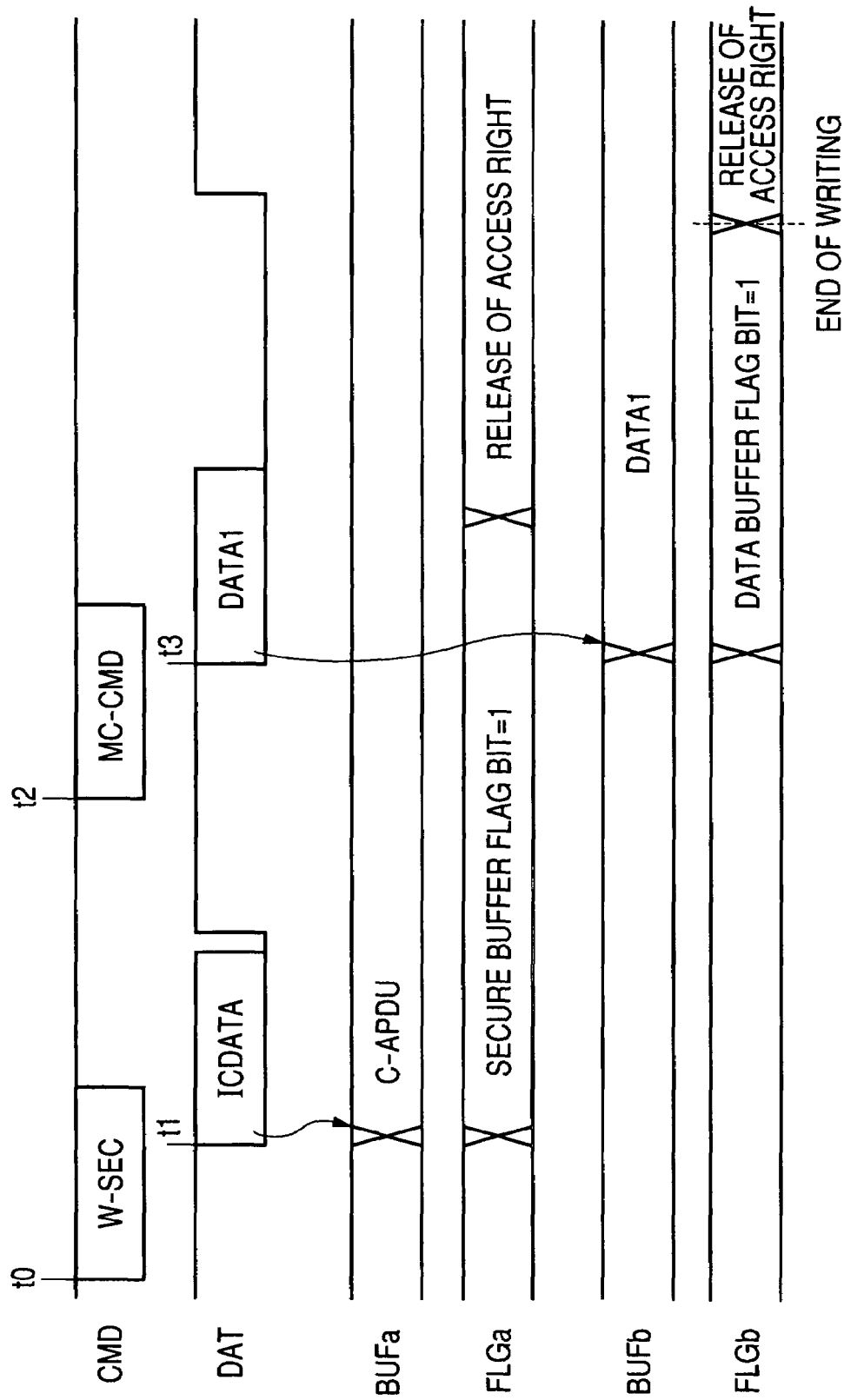
FIG. 9 is an operating timing chart when a write secure command and a standard memory card command which instructs flash write access are inputted in succession.

FIG. 9 illustrates a timing chart when the write secure command and the standard memory card command which instructs flash write access are inputted in succession. The write secure command (W-SEC) is inputted to the command terminal CMD (time t0) and the IC card command (IC-APDU) is inputted to the data I/O terminal DAT (time t1). Since both of the buffers 12C and 11C are unoccupied, the IC card command (C-APDU) is stored in the buffer 12C as one of the two buffers and the secure buffer flag bit of the flag FLGa is set. Thereafter, the standard memory card command (MC-CMD) is inputted to the command terminal CMD (time t2) and the write data DATA1 is inputted to the data I/O terminal DAT (time t3). Since the buffer 11C as one of the two buffers is unoccupied, the write data DATA1 is stored in the buffer 11C and the data buffer flag bit of the flag FLGb is set.

—Command Task Process—

Figure 10:
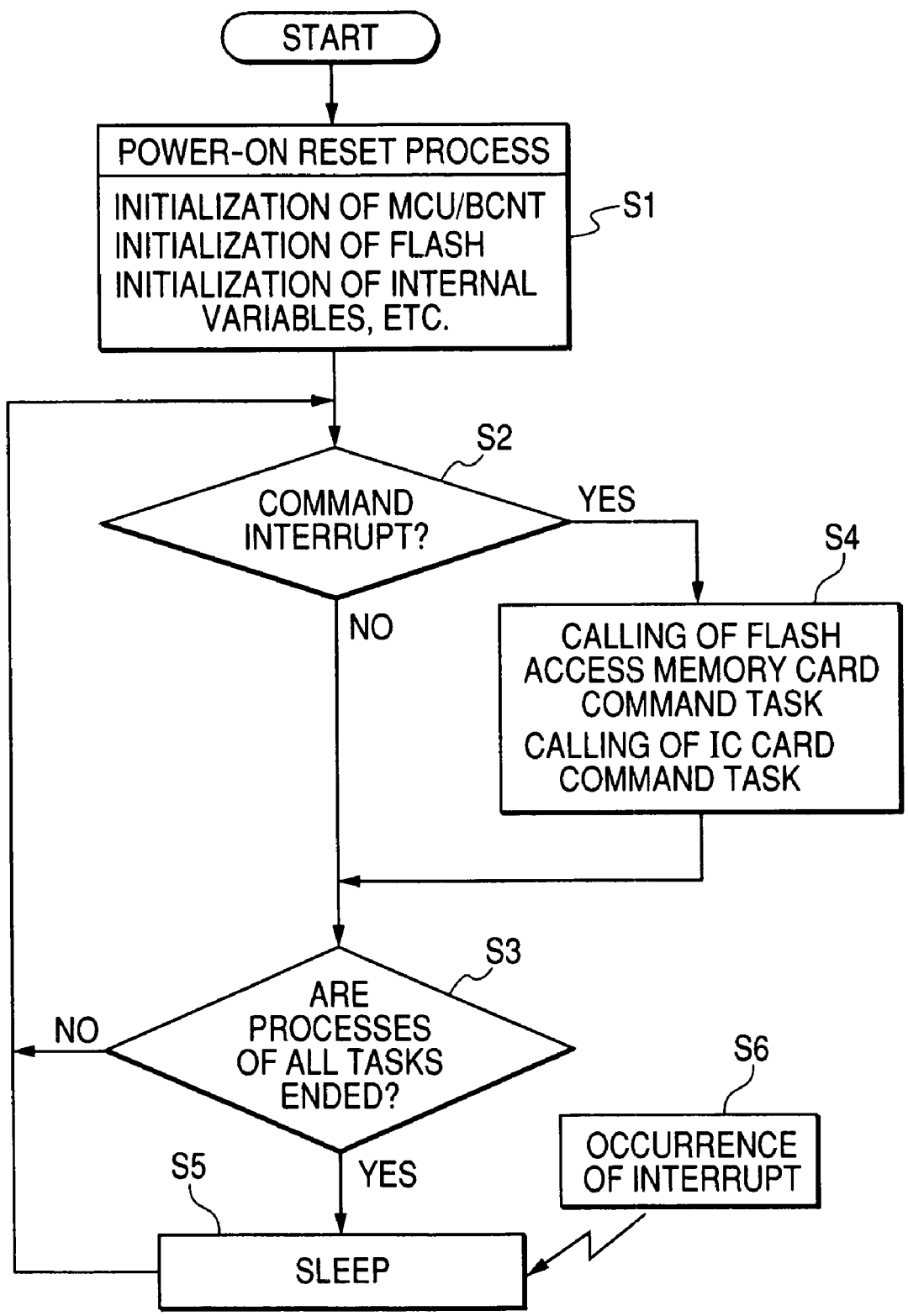
FIG. 10 is a flowchart showing an overall process flow in a microcomputer.
Figure 11:
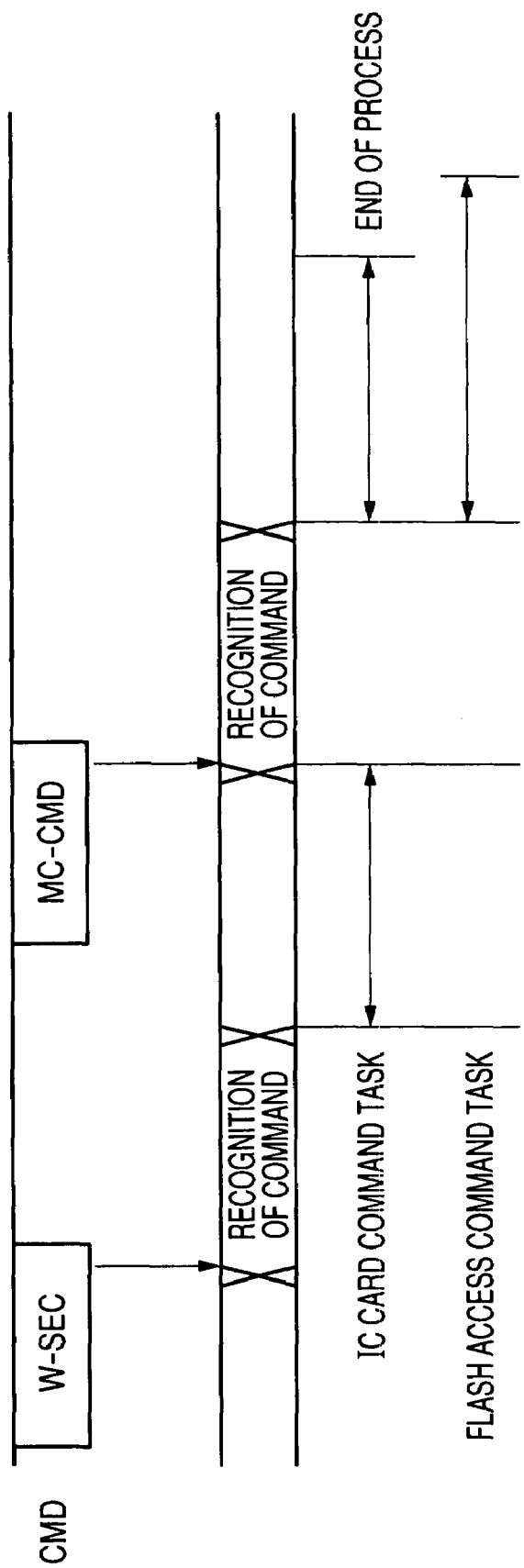
FIG. 11 is a timing chart showing the state of execution of a task resulting from a command interrupt.

FIG. 10 shows the overall process flow in the microcomputer. The microcomputer 15 performs an initializing operation on a power-on reset and thereby initializes the flash memory chip 5, internal variables, and the like (S1). Thereafter, the microcomputer 15 waits for the occurrence of an interrupt (command interrupt) resulting from the inputting of the command from the host interface 10 (S2, S3). When there is a command interrupt, the microcomputer 15 calls a flash access memory card command task or an IC card command task in accordance with the command code thereof and executes it (S4). The flash access memory card command task is activated by the standard memory card command which instructs access to the flash memory chip 5. The IC card command task is activated by the write secure command or by a read secure command. When another task is called in overlapping relation during the process of the called task, the microcomputer 15 responds thereto. When the processes of all the tasks are ended, the microcomputer 15 comes into the a sleep state (low-power-consumption state) (S5). For example, the operating clock for the microcomputer 15 is halted. The sleep state can be released by the occurrence of an interrupt (S6). FIG. 11 shows the state of execution of a task resulting from a command interrupt.

Figure 12:
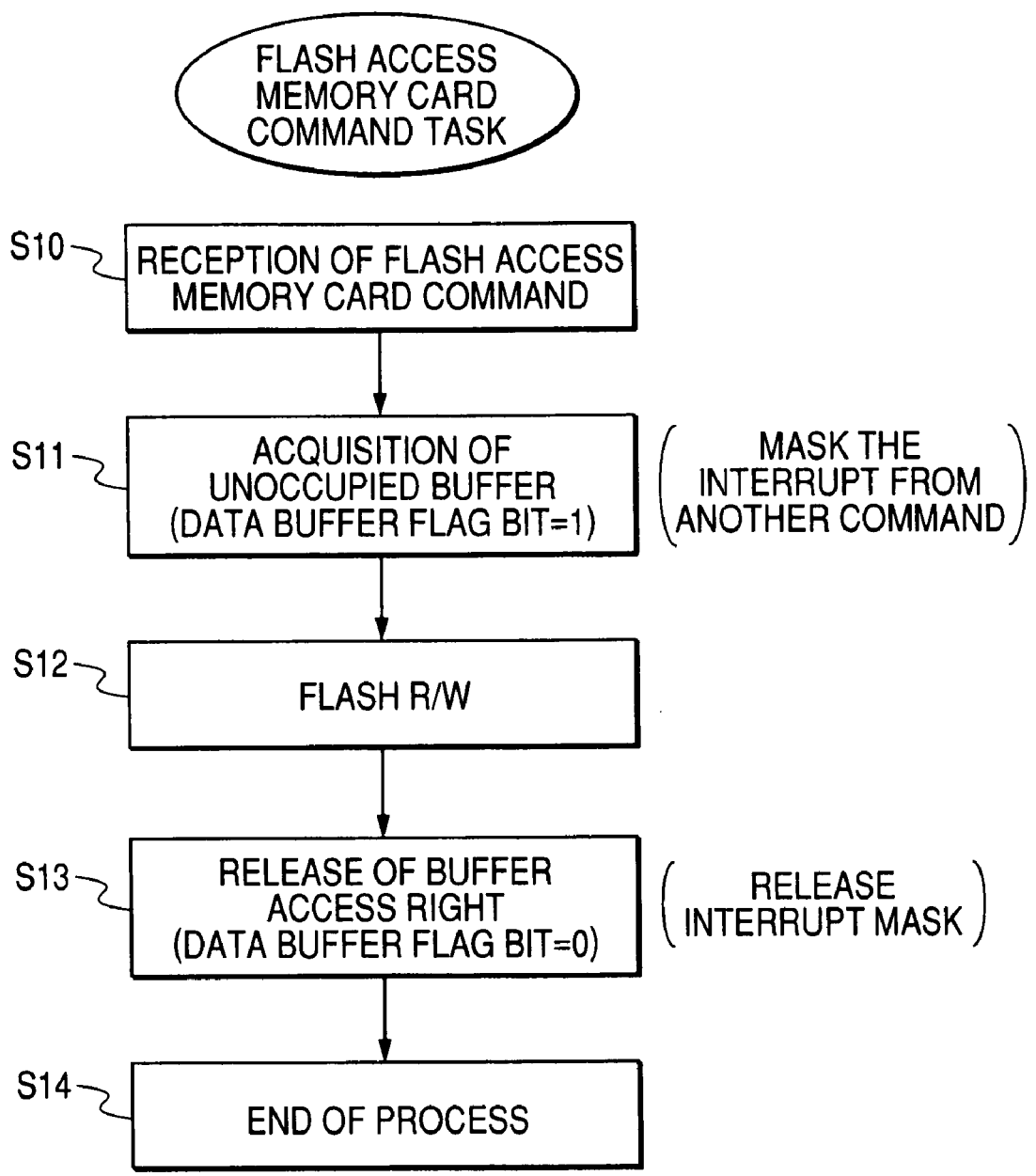
FIG. 12 is a flowchart showing a process flow in accordance with a flash access command task in the third embodiment of buffer control.

FIG. 12 shows a process flow in accordance with a flash access command task in the third embodiment of buffer control. The microcomputer 15 branches to an interrupt process corresponding to a flash access memory card command received by the host interface 10, i.e., to a specified flash access memory card command task (S10). As a result, the microcomputer retrieves the data buffer flag bit in the set state (=1) by referencing the flags FLGa and FLGb. When the microcomputer has retrieved the data buffer flag bit in the set state, it performs a process of masking an interrupt request in accordance with another command (S1). Then, the microcomputer 15 uses the buffer having the data buffer flag bit in the set state and corresponding to the flag and performs a write or operation to the flash memory chip 6 or the like in accordance with the command task (S12). When the microcomputer 15 ends the flash access, it clears (=0) the data buffer flag bit of the flag corresponding to the buffer used for the flash access and releases the access right to the buffer (S13). At the same time, the microcomputer 15 releases the interrupt mask and ends the flash access memory card command task (S14). It is to be noted that, in the first and second embodiments of buffer control, different processes are performed in Steps S11 and S13 in terms of using the predetermined data buffers.

Figure 13:
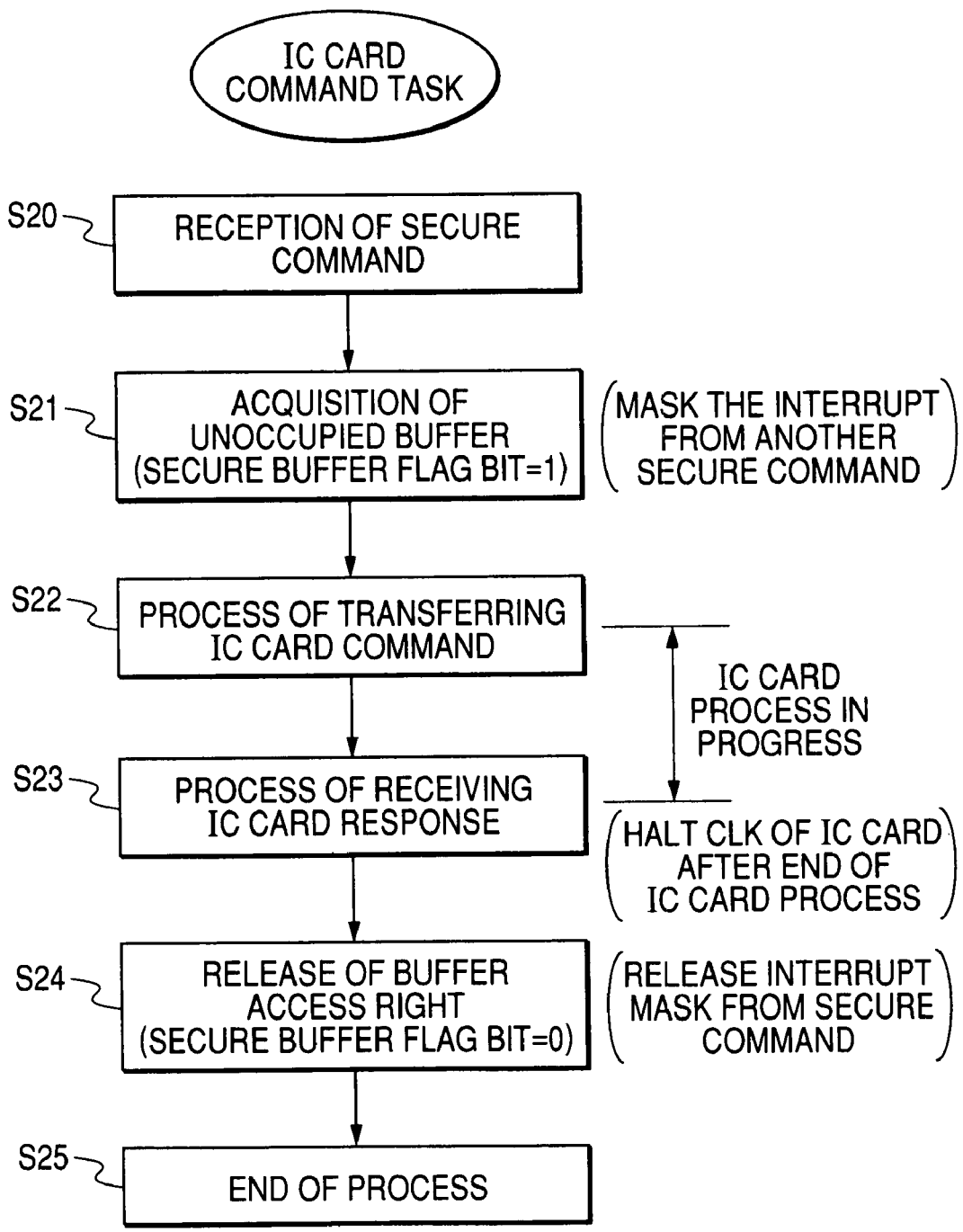
FIG. 13 is a flowchart showing a process flow in accordance with an IC card command task in the third embodiment of buffer control.

FIG. 13 shows a process flow in accordance with the IC card command task in the third embodiment of buffer control. The microcomputer 15 branches to an interrupt process corresponding to the secure command received by the host interface 10, i.e., to a specified IC card command task (S20). As a result, the microcomputer retrieves the secure buffer flag bit in the set state (=1) by referencing the flags FLGa and FLGb. When the microcomputer has retrieved the secure buffer flag bit in the set state, it performs a process of masking an interrupt request in accordance with another secure command (S21). Then, the microcomputer 15 gives, to the IC card interface 14, an instruction to transfer the IC card command from the buffer corresponding to the secure buffer flag bit in the set state to the IC card chip (S22). The IC card chip 6 performs the IC card process in accordance with the IC card command transferred in accordance with the instruction and returns the result of the process to the IC card interface 14. The IC card interface 14 transfers the IC card response to the retrieved buffer. The microcomputer 15 receives the IC card response currently being transferred and determines the presence or absence of a necessary post process based on the received IC card response (S23). When there is no need for a post process, the microcomputer 15 waits for a read operation in accordance with the read secure command issued from the host device 2, while leaving the IC card response in the buffer as it is. When it is sufficient to merely perform an internal process with respect to the IC card response, the microcomputer 15 performs the process and clears (=0) the secure buffer flag bit of the flag corresponding to the buffer used for the IC card process and releases the access right to the buffer (S24). At the same time, the microcomputer 15 releases the interrupt mask in accordance with the secure command and ends the IC card command task (S25). It is to be noted that, in the first and second embodiments of buffer control, different processes are performed in Steps S21 and S24 in terms of using the predetermined data buffers.

Figure 14:
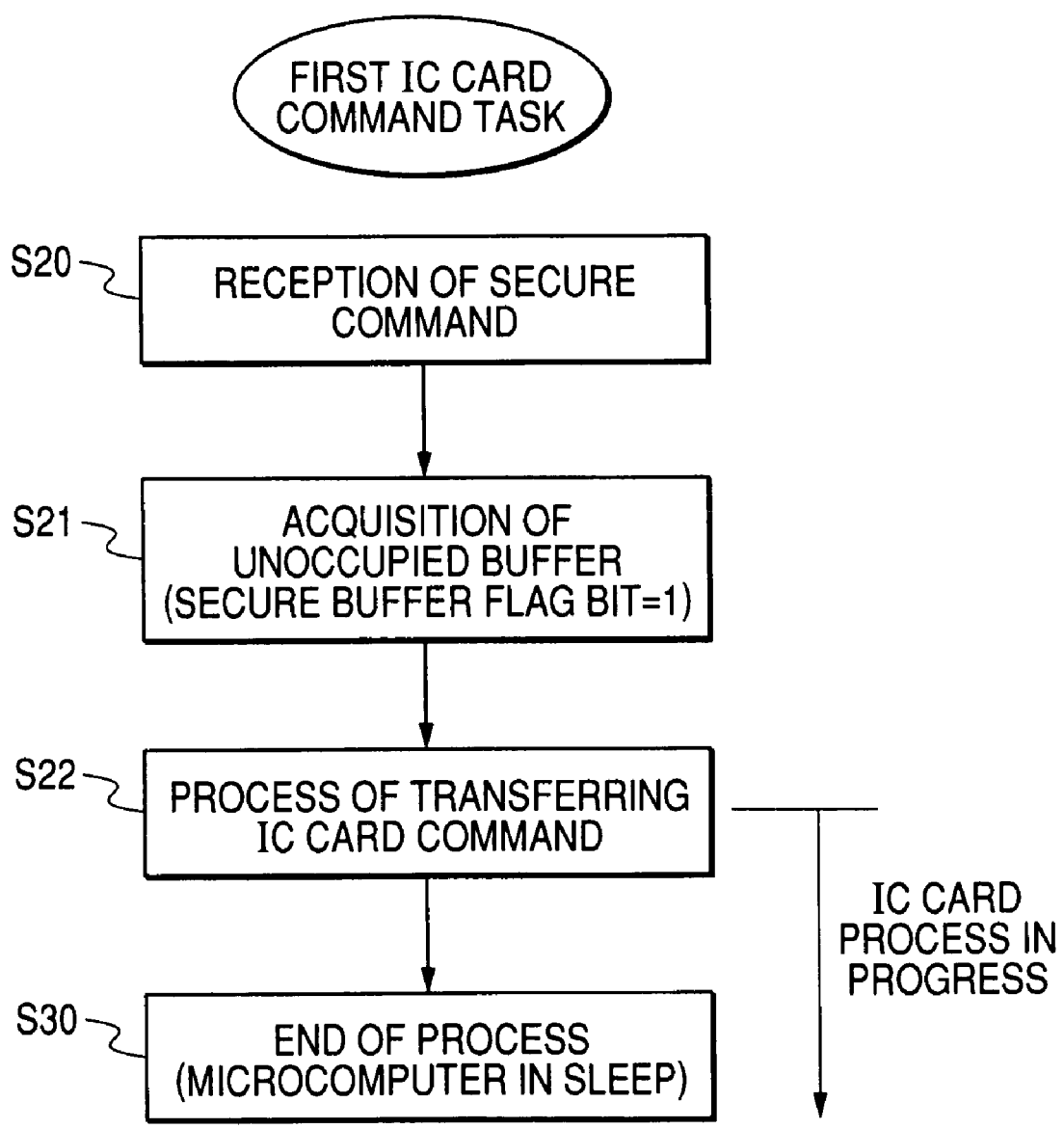
FIG. 14 is a flowchart for a process in accordance with IC Card Command Task 1 before the microcomputer is brought into a sleep state during an IC card process.
Figure 15:
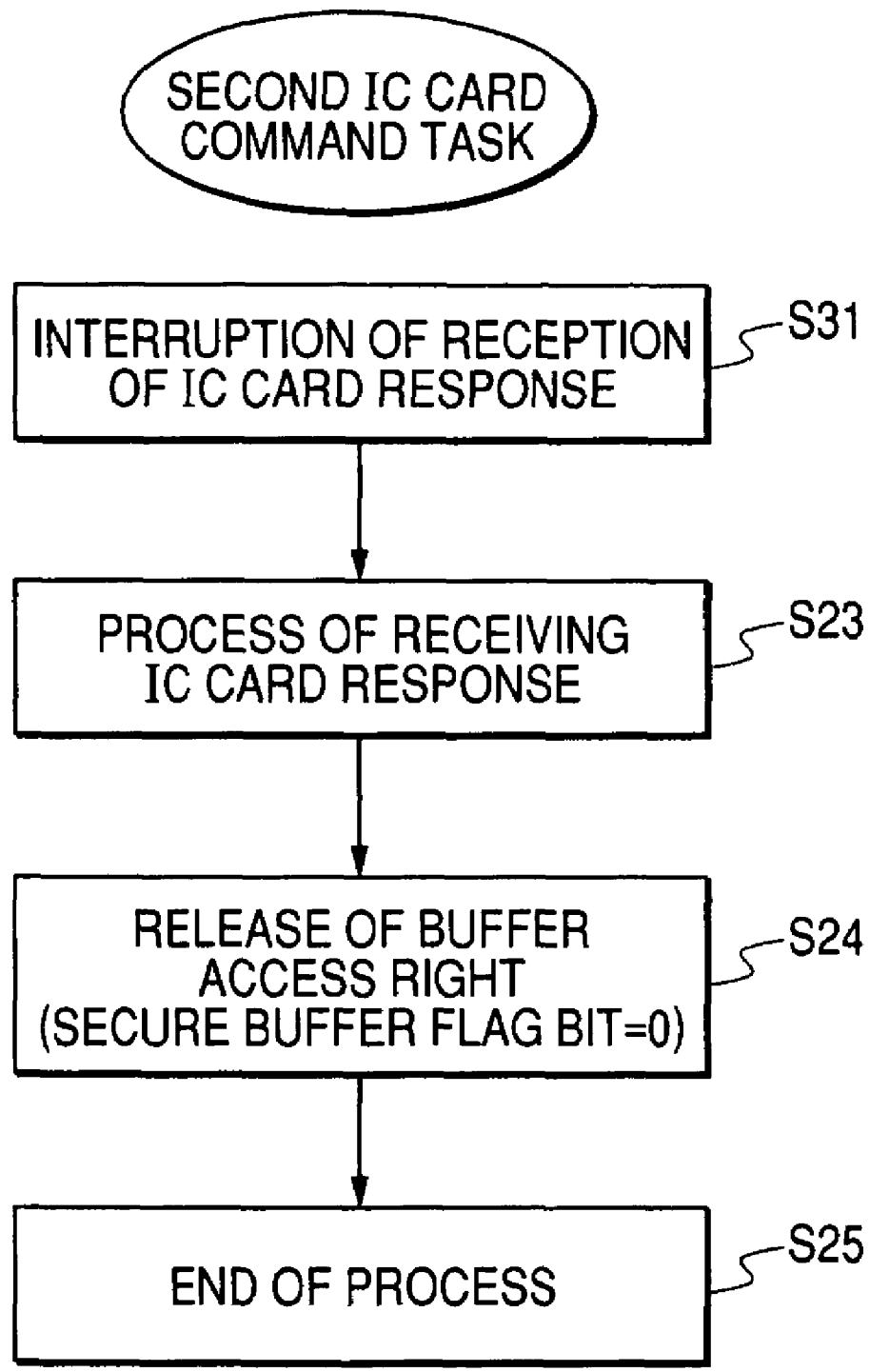
FIG. 15 is a flowchart for a process in accordance with IC Card Command Task 2 activated from the sleep state.

FIGS. 14 and 15 show process flows in accordance with IC card command tasks when the microcomputer is brought into the sleep state during the IC card process. FIG. 14 shows the process flow in accordance with the first IC card command task before the microcomputer is brought into the sleep state. FIG. 15 shows the process flow in accordance with the second IC card command task activated by the release of the sleep state. Steps S20 to S22 and Steps S23 to S25 are the same as in FIG. 13. After transferring the IC card command in Step S22, the microcomputer 15 shifts to the sleep state by, e.g., executing a sleep instruction and ends the process of the task (S30). In the sleep state, the operating clock for the microcomputer 15 is halted and the microcomputer 15 is brought into the low-power-consumption state. During the period when the microcomputer 15 is in the sleep state, the IC card chip 6 performs the IC card process in accordance with the transferred IC card command. When the IC card process by the IC card chip is ended, the IC card response is returned to the IC card interface 14. The IC card interface 14 gives a request to interrupt the reception of the IC card response to the microcomputer 15 and thereby releases the sleep state of the microcomputer 15 (S31). As a result, the microcomputer 15 receives the IC card response currently being transferred in synchronization with the transfer of the IC card response to the specified buffer mentioned above by the IC card interface 14, determines the presence or absence of a necessary post process (S23), and performs the processes of Steps 24 and 25 mentioned above.

Figure 16:
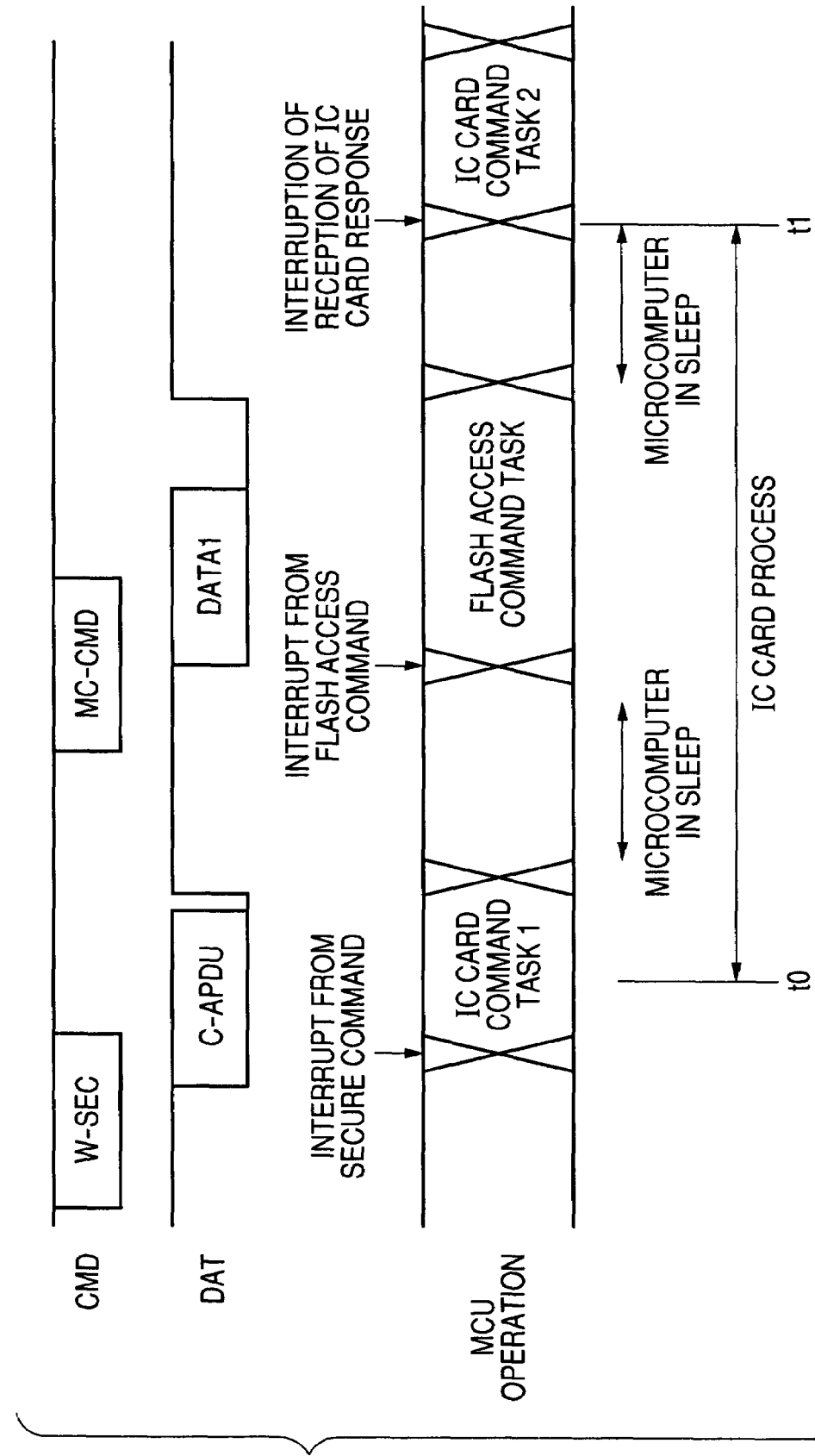
FIG. 16 is a timing chart illustrating a command operation timing during the IC card command task of FIGS. 14 and 15.

FIG. 16 illustrates a command operation timing during the process of the IC card command task of FIGS. 14 and 15. The IC card chip 6 can execute the flash access memory card command task during the IC card process (times t0 to t1) performed thereby in accordance with the IC card command task responding to the write secure command (W-SEC), while the microcomputer 15 can execute the flash access memory card command task in response to a 6flash command interrupt in accordance with the standard memory card command. When the microcomputer 15 ends the execution of the flash access memory card command task, it is brought into the sleep state, which is released by the interruption of the reception of the IC card response. Thereafter, the microcomputer 15 executes the second IC card command task.

—Avoidance of Competition between Flash Memory Accesses—

Figure 17:
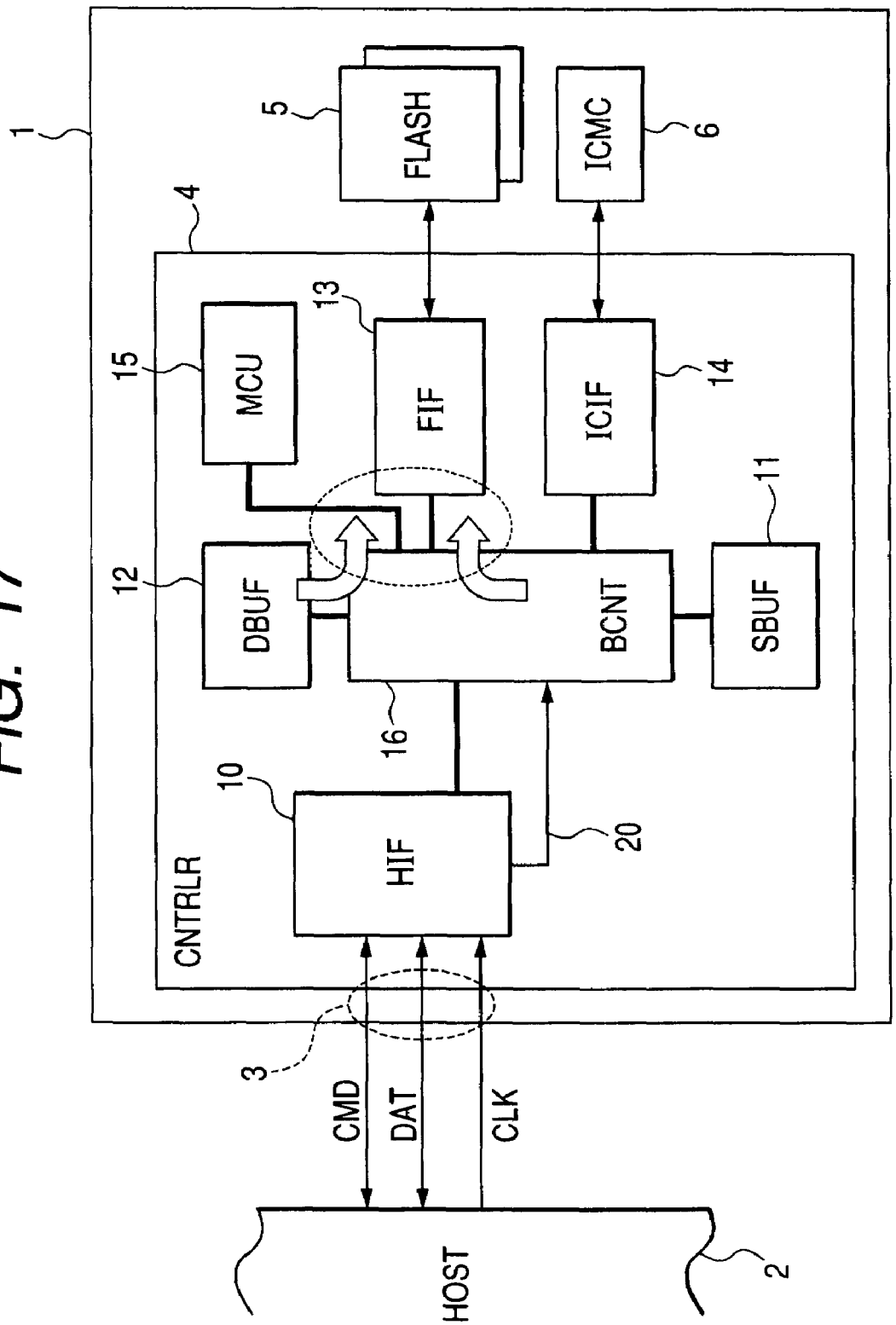
FIG. 17 is a block diagram illustrating a state in which access to a flash memory chip is made necessary by an IC card response.

FIG. 17 illustrates the state in which the IC card response has caused the necessity for access to the flash memory chip 5. The microcomputer 15 determines the IC card response to be transferred to the secure buffer 11 via the IC card interface 14. When the IC card response includes flash write instruction information together with the secure data, it becomes necessary to write the secure data of the IC card response in the flash memory chip 5 (flash interoperation process). At this time, it is checked whether or not the flash memory chip 5 has already been accessed in response to the flash access memory card command. When the flash memory chip 5 has not been accessed, an access right is acquired and then the flash memory chip 5 is accessed in response to the IC card response. The acquisition of the access right to the flash memory chip 5 is performed by, e.g., the microcomputer 15 with respect to the flash interface 13.

Figure 18:
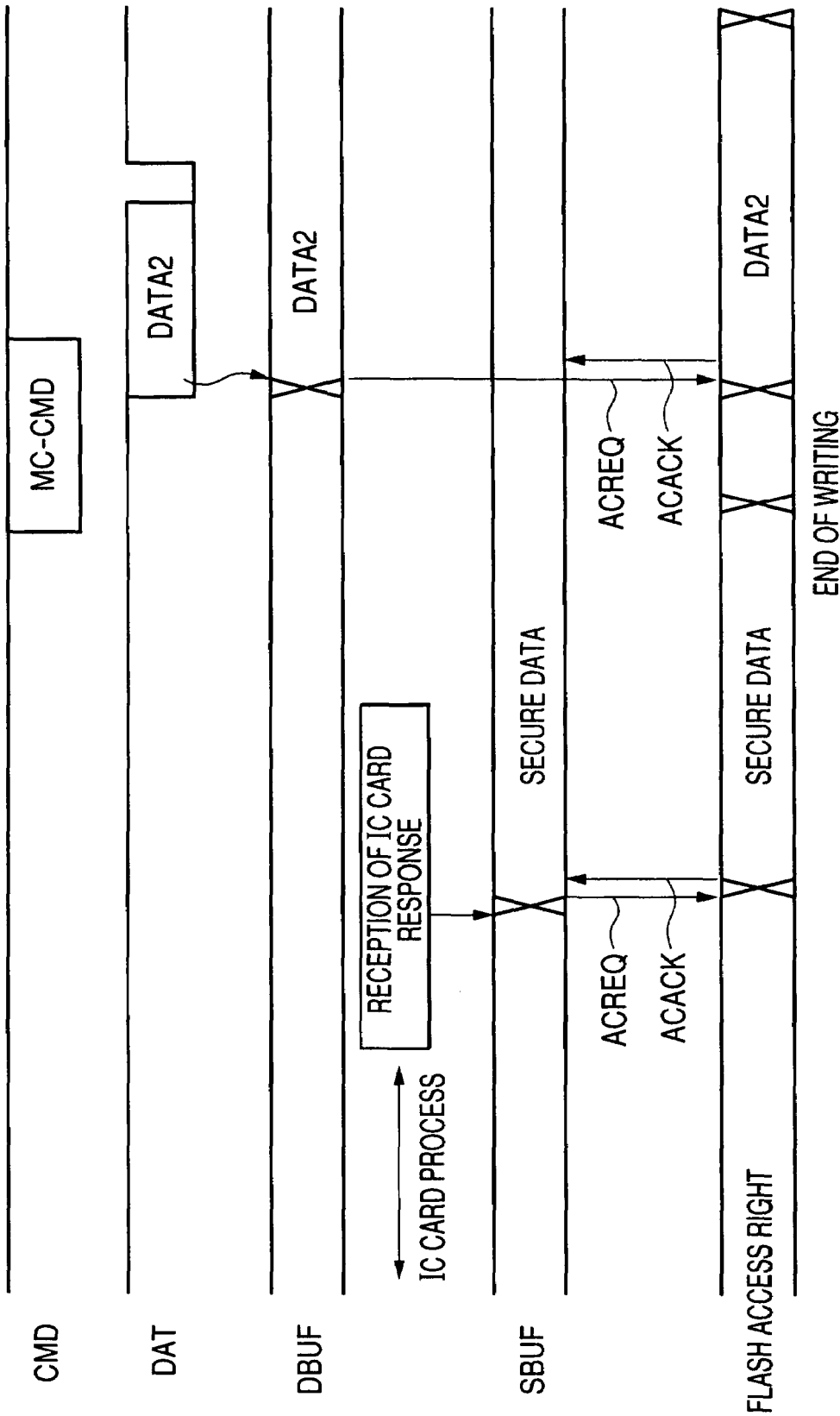
FIG. 18 is an operational timing chart when access to the flash memory chip responding to the IC card response and access to the flash memory chip in accordance with a standard memory card command are requested in succession.

FIG. 18 illustrates an operational timing when access to the flash memory chip 5 responding to the IC card response and access to the flash memory chip 5 in accordance with the standard memory card command are requested in succession. When it is determined that access to the flash memory chip 5 is necessary based on the IC card response transferred to the secure buffer 11, a flash access request ACREQ for writing the secure data from the secure buffer 11 in the flash memory chip 5 is issued from the microcomputer 15 to the flash interface 13. By obtaining an acknowledgment ACACK to the request, the microcomputer 15 issues a flash access command to the flash interface 13 and writes the secure data in the flash memory chip 5. Thereafter, when the standard memory card command (MC-CMD) is inputted and the accompanying write data DATA2 is supplied to the data buffer 12, a flash access request ACREQ for writing the data from the data buffer 12 in the flash memory chip 5 is issued from the microcomputer 15 to the flash interface 13. By obtaining the acknowledgment ACACK of the access right to the request, the microcomputer 15 issues a flash access command to the flash interface 13 and writes the data DATA2 in the flash memory chip 5. When the flash access requests compete with each other, the subsequent access request is acknowledged after waiting for the access related to the previous access request to end.

Figure 19:
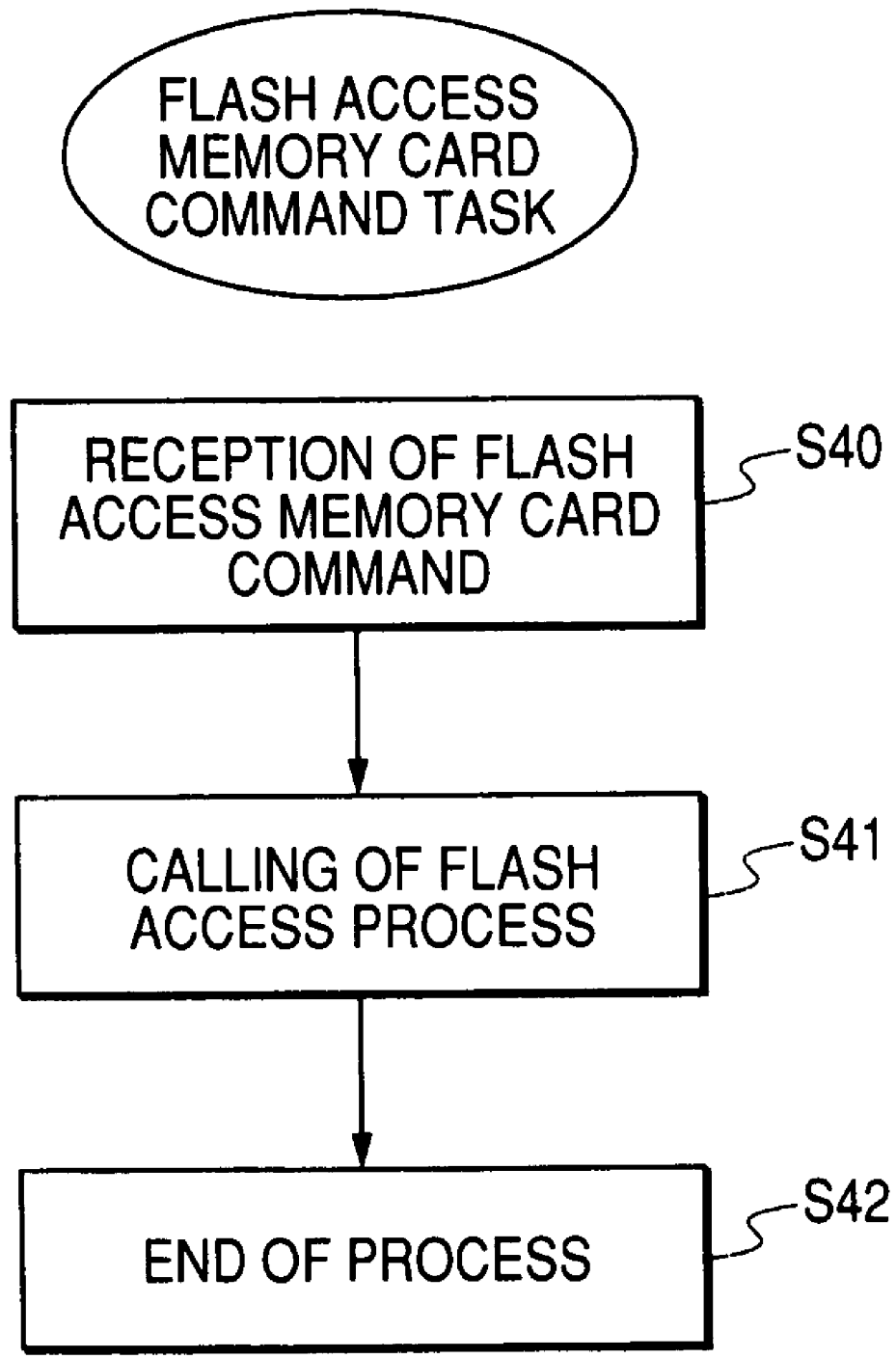
FIG. 19 is a process flowchart for the flash access command task focusing attention on the control of a flash access right.

FIG. 19 shows a process flow for the flash access command task focusing attention on the control of a flash access right. The microcomputer 15 responds to the flash access memory card command received by the host interface 10 and thereby branches to the corresponding interrupt process, i.e., to a specified flash access memory card command task (S40). As a result, the microcomputer calls an access process to the flash memory chip 5. At the start of the called access process, the microcomputer requests an access right of the flash interface 13. The microcomputer 15 waits for the acknowledgment of the access right and issues a flash access command to the flash interface 13 (S41). Upon receipt of the command, the flash interface 13 writes the write data from the data buffer 12 in the flash memory chip 5 or stores the data read from the flash memory chip in the data buffer 12 and outputs it to the outside, thereby ending the process (S42).

Figure 20:
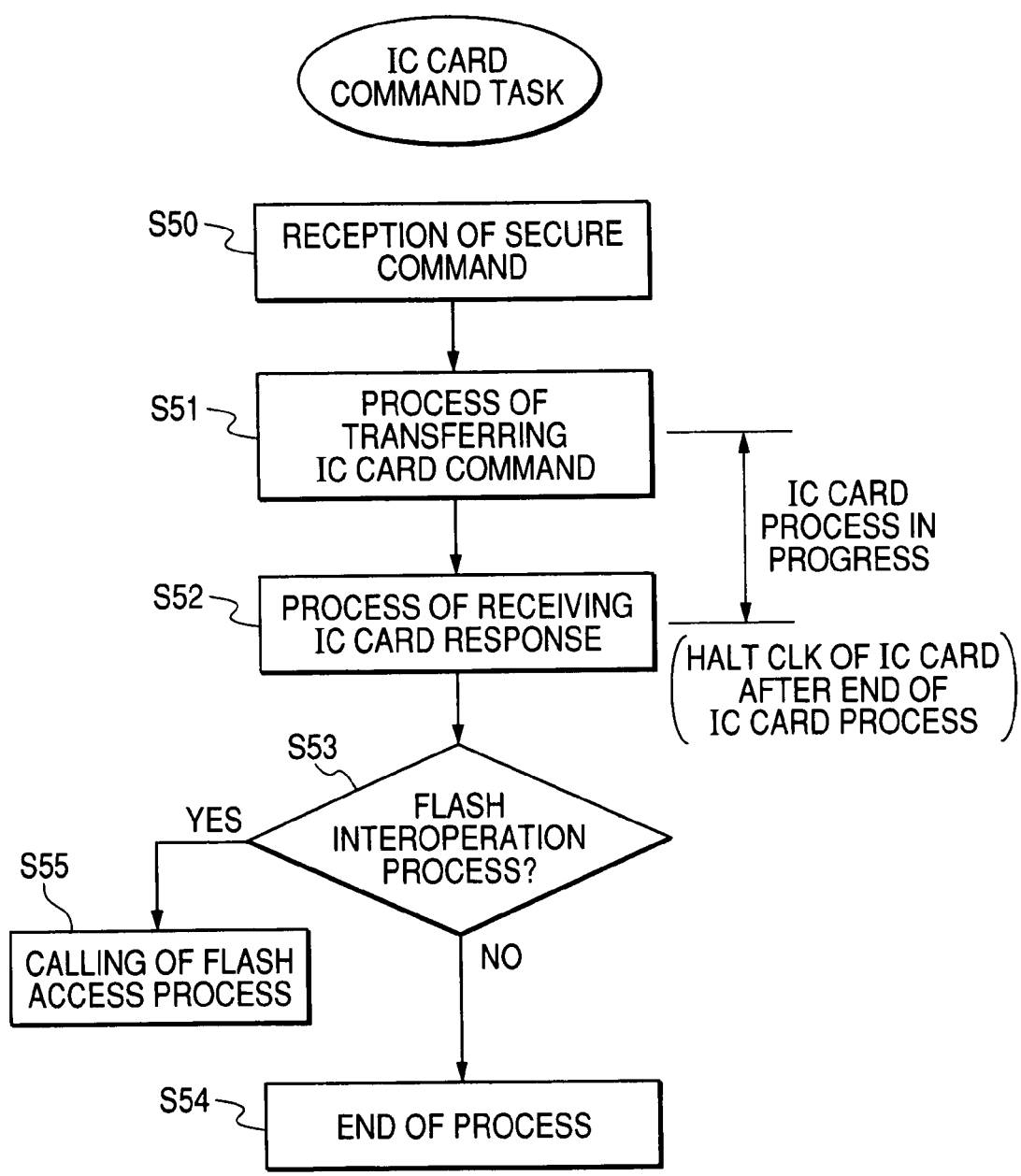
FIG. 20 is a process flowchart for the IC card command task focusing attention on the control of the flash access right.

FIG. 20 shows a process flow for the IC card command task focusing attention on the control of the flash access right. The microcomputer 15 responds to the secure command received by the host interface 10 and thereby branches to the corresponding interrupt process, i.e., to a specified IC card command task (S50). As a result, the microcomputer instructs the IC card interface 14 to transfer the IC card command from the secure buffer 11 to the IC card chip (S51). The IC card chip 6 performs the IC card process in accordance with the transferred IC card command and returns the result of the process to the IC card interface 14 (S52). The IC card interface 14 transfers the IC card response to the secure buffer 11. After the completion of the transfer, the microcomputer 15 acquires the IC card response from the secure buffer 11 and determines whether or not the flash interoperation process is necessary (S53). When the flash interoperation process is not necessary, the microcomputer 15 ends the process (S54). When the flash interoperation process is necessary, the microcomputer calls an access process to the flash memory chip 5 (S55). At the start of the called access process, the microcomputer requests an access right of the flash interface 13. The microcomputer 15 waits for the acknowledgment of the access right and issues a flash access command to the flash interface 13. Upon receipt of the command, the flash interface 13 writes the write data from the secure buffer 11 in the flash memory chip 5, thereby ending the process.

Figure 21:
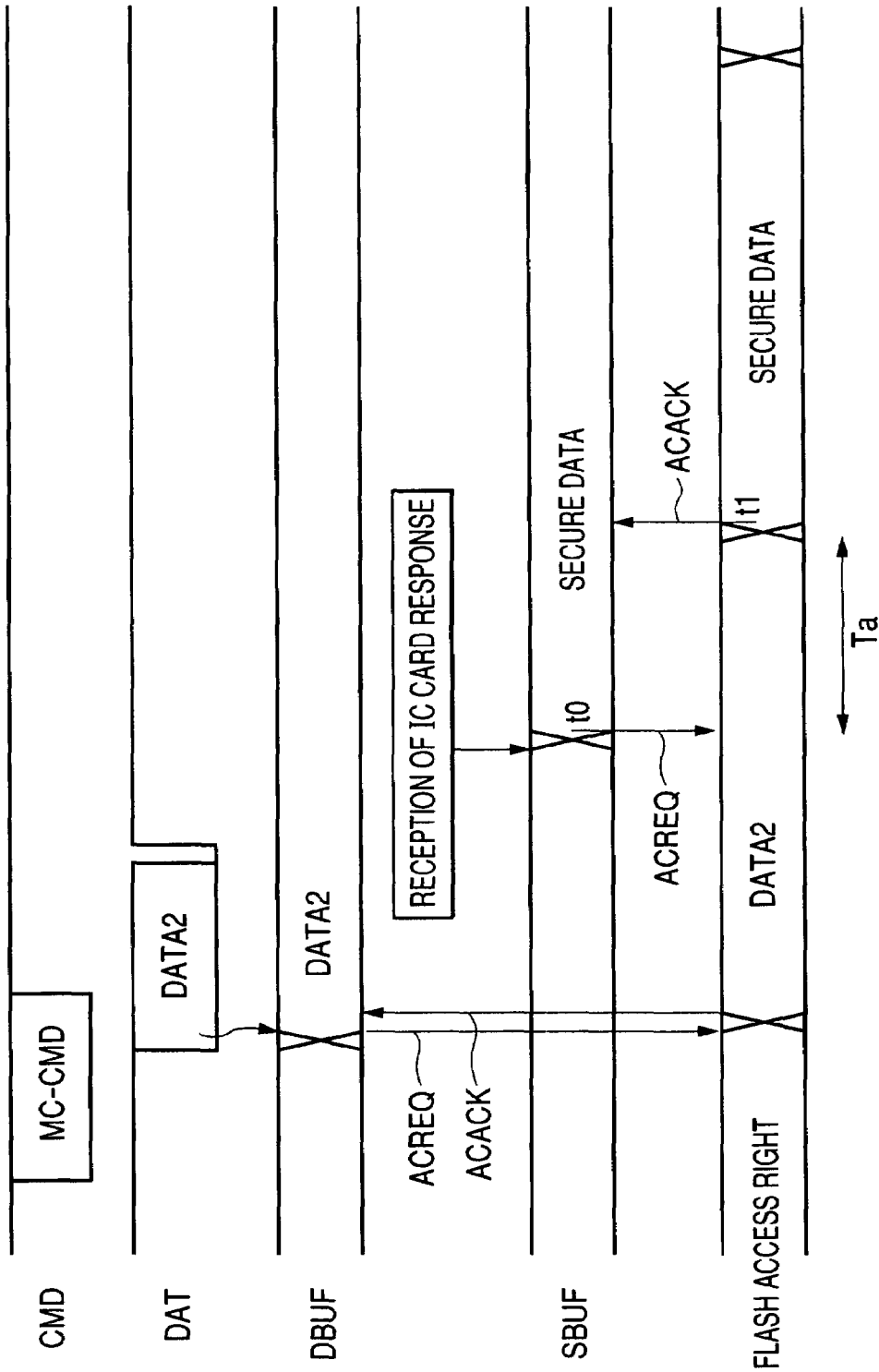
FIG. 21 is an operational timing chart when a flash access request for a flash interoperation process is issued during a process performed in accordance with a flash access request responding to a flash access memory card command.

FIG. 21 illustrates an operational timing when a flash access request for the flash interoperation process is issued during the process in accordance with the flash access request responding to the flash access memory card command. When the standard memory card command (MC-CMD) is inputted and the accompanying write data DATA2 is supplied to the data buffer 12, a flash access request ACREQ for writing the data from the data buffer 12 in the flash memory chip 5 is issued from the microcomputer 15 to the flash interface 13. By obtaining the acknowledgment ACACK of the access right to the request, the microcomputer 15 issues a flash access command to the flash interface 13 and writes the data DATA2 in the flash memory chip 5. When the IC card process performed by the IC card chip 6 in parallel with the flash write operation is ended, the IC card response is transferred to the secure buffer 11. When it is determined that access to the flash memory chip 5 is necessary based on the IC card response transferred to the secure buffer 11, a flash access request ACREQ for writing the secure data from the secure buffer 11 in the flash memory chip 5 is issued from the microcomputer 15 to the flash interface 13 (time t0). At this time, the flash access right has been already acknowledged to the flash access request responding to the flash access memory card command. The acknowledgment of the access right to the flash access request resulting from the IC card response is performed after waiting for the completion of the writing of the data DATA2 (time t1). By obtaining an acknowledgment ACACK to the request, the microcomputer 15 issues a flash access command to the flash interface 13 and writes the secure data in the flash memory chip 5. The flash access request resulting from the IC card response is kept waiting for a time period Ta till it acquires the flash access right.

Figure 22:
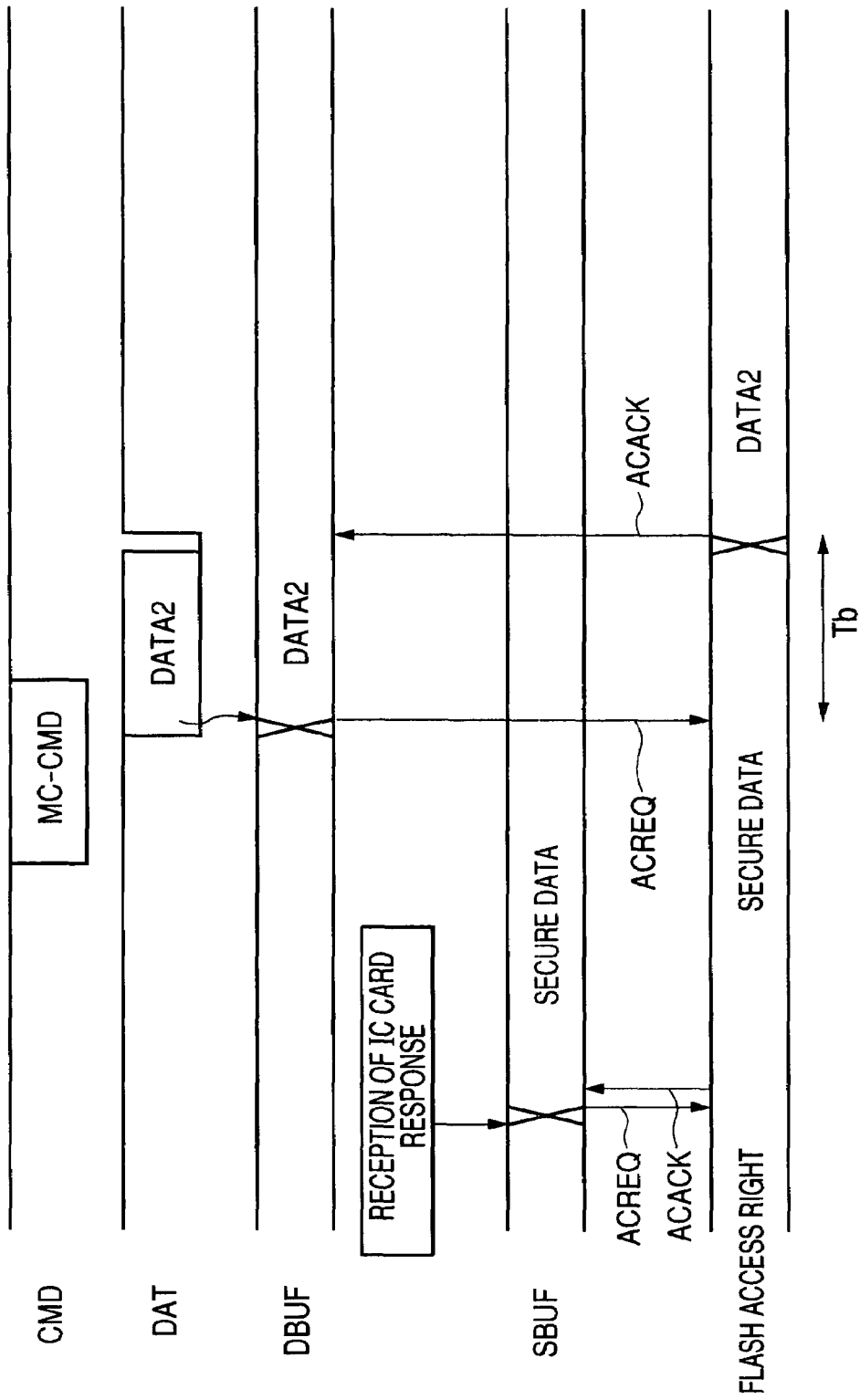
FIG. 22 is an operational timing chart when a flash access request responding to the flash access memory card command is issued during a process performed in accordance with the flash access request for the flash interoperation process.

FIG. 22 illustrates an operational timing when a flash access request responding to the flash access memory card command is issued during a process in accordance with the flash access request for the flash interoperation process. Conversely to the operational timing shown in FIG. 21, a flash access request ACREQ responding to the standard memory card command (MC-CMD) is issued (time t0) during the flash access resulting from the IC card response. The acknowledgment of the access right to the flash access request ACREQ responding to the standard memory card command (MC-CMD) is performed after waiting for the completion of the writing of the secure data (time t2). By obtaining an acknowledgment ACACK to the request, the microcomputer 15 issues a flash access command to the flash interface 13 and writes the data DATA2 in the flash memory chip 5. The flash access request responding to the standard memory card command (MC-CMD) is kept waiting for a time period Tb till it acquires the flash access right.

Figure 23:
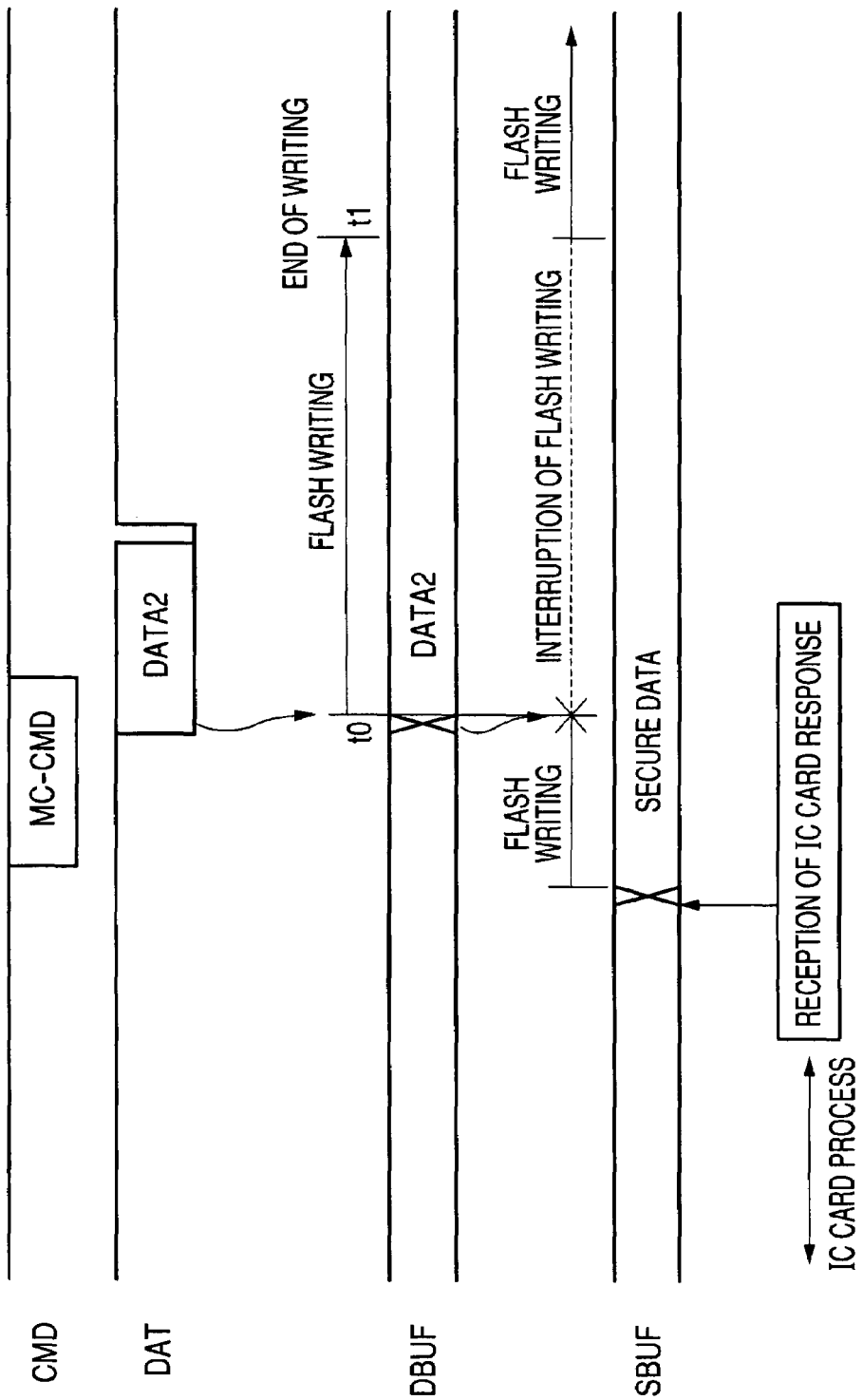
FIG. 23 is an operational timing chart when a flash access request responding to the standard memory card command is preferentially accepted.

FIG. 23 is an operational timing chart when the flash access request responding to the standard memory card command (MC-CMD) is preferentially accepted. FIGS. 21 and 22 described above show examples when the avoidance of competition is performed depending on which one of the flash access requests is issued earlier or later. However, it is also possible to preferentially respond to a new command issued from the host device 2. In FIG. 23, the standard memory card command (MC-CMD) is issued from the host device 2 during the operation of writing the secure data in the flash memory chip 5 in response to the IC card response. As a result, the microcomputer 15 shifts to an interrupt process in accordance with the flash access memory card command task and causes the flash interface 13 to interrupt the process of writing the secure data (time t0). Instead, the microcomputer 15 instructs the flash interface 13 to perform the operation of writing the data DATA2 from the data buffer 12 in the flash memory. When the flash interface 13 completes the writing of the data DATA2 (time t1), it resumes the writing of the secure data interrupted at the time t1.

Figure 24:
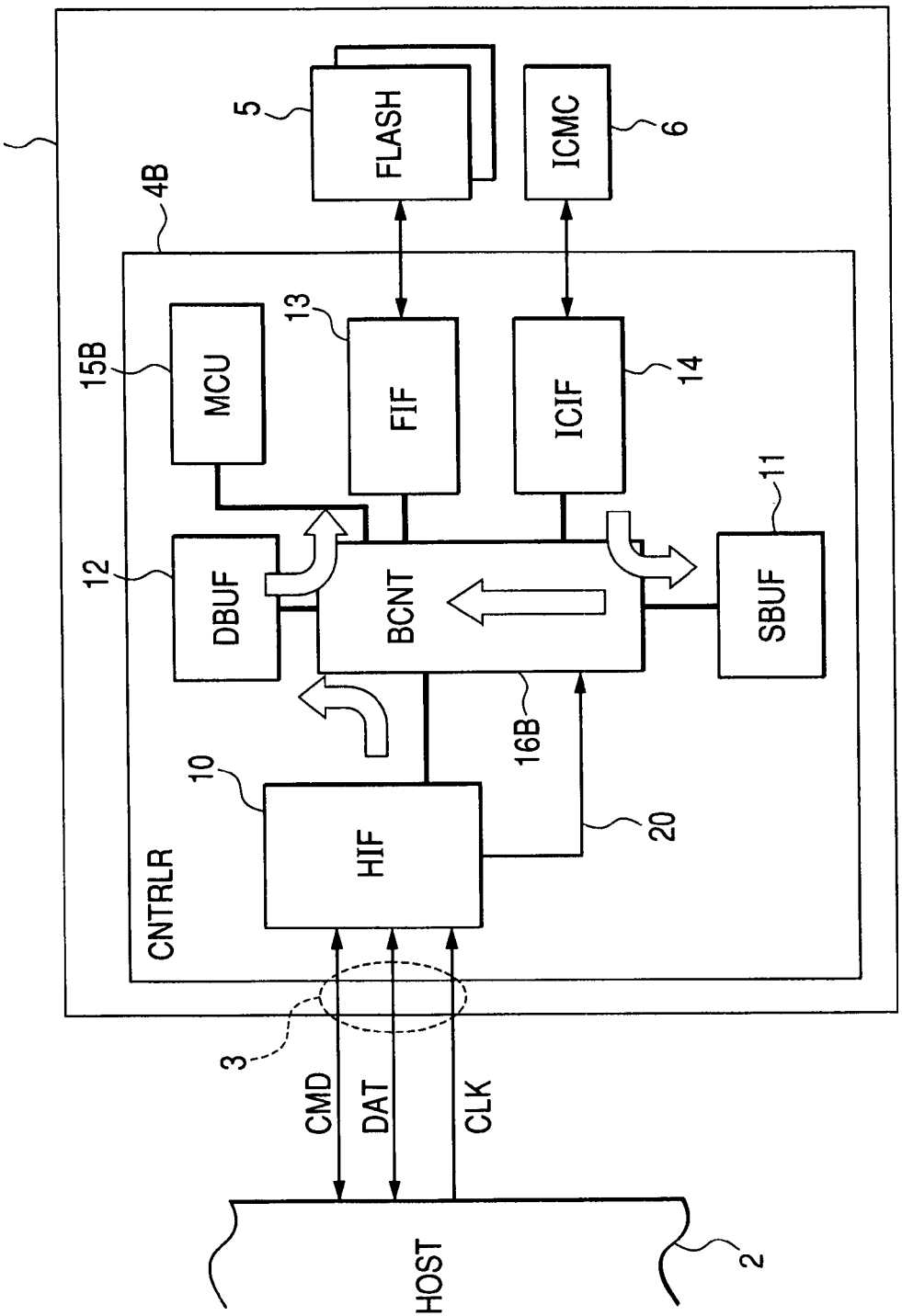
FIG. 24 is a block diagram showing an embodiment of data competition which occurs when flash memory access is requested in the second embodiment of buffer control of FIG. 6.
Figure 25:
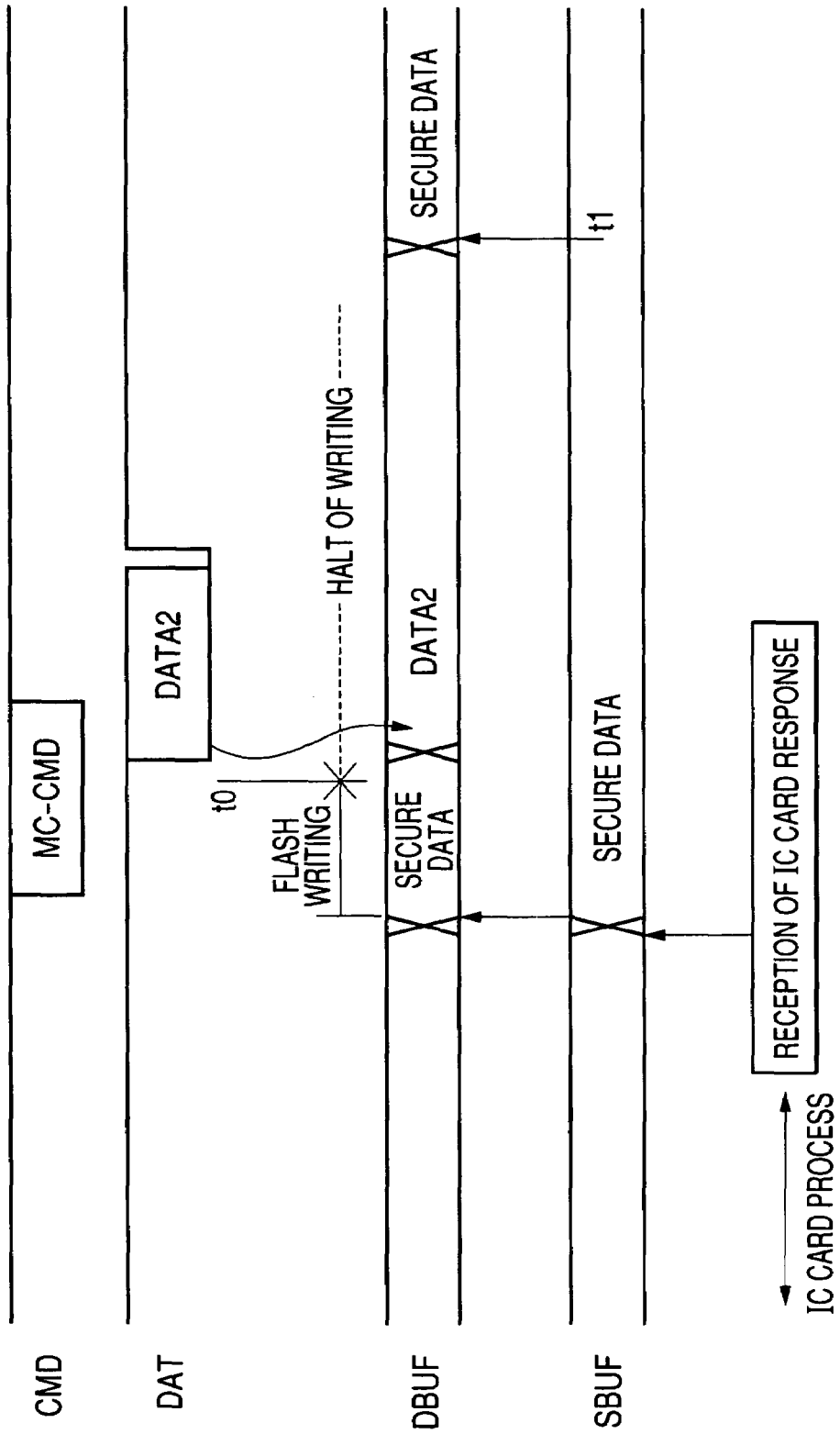
FIG. 25 is a timing chart showing a state in which the standard memory card command is issued from a host device while the microcomputer is transferring secure data from a secure buffer to a data buffer in response to the IC card response.

FIG. 24 shows an embodiment of data competition which occurs in a structure in which flash memory access is permitted only from the DBUF 12. In the second embodiment of buffer control, the write data held in the data buffer 12 is transferred to the flash memory chip 5. Accordingly, in the flash memory access (flash interoperation process) resulting from the IC card response, the secure data included in the IC card response stored in the secure buffer 11 is transferred to the data buffer 12. The operation of transferring the secure data to the data buffer 12 has the possibility of competing with the operation of storing the data inputted together with the standard memory card command (MC-CMD) in the data buffer 12. For the avoidance of the competition, it is possible to, e.g., preferentially respond to a new command issued from the host device 2. In FIG. 25, the standard memory card command (MC-CMD) is issued from the host device 2 while the secure data is transferred from the secure buffer 11 to the data buffer 12 by the microcomputer 15 in response to the IC card response. As a result, the microcomputer 15 shifts to an interrupt process in accordance with the flash access memory card command task and halts the transfer of the secure data (time t0). This allows the data DATA2 inputted from the data I/O terminal DAT to be accumulated in the data buffer 12. When the storage of the data DATA2 in the data buffer 12 is completed (time t1), the microcomputer performs the data transfer from the secure buffer to the data buffer again from the beginning.

—Encryption Operation Unit—

Figure 26:
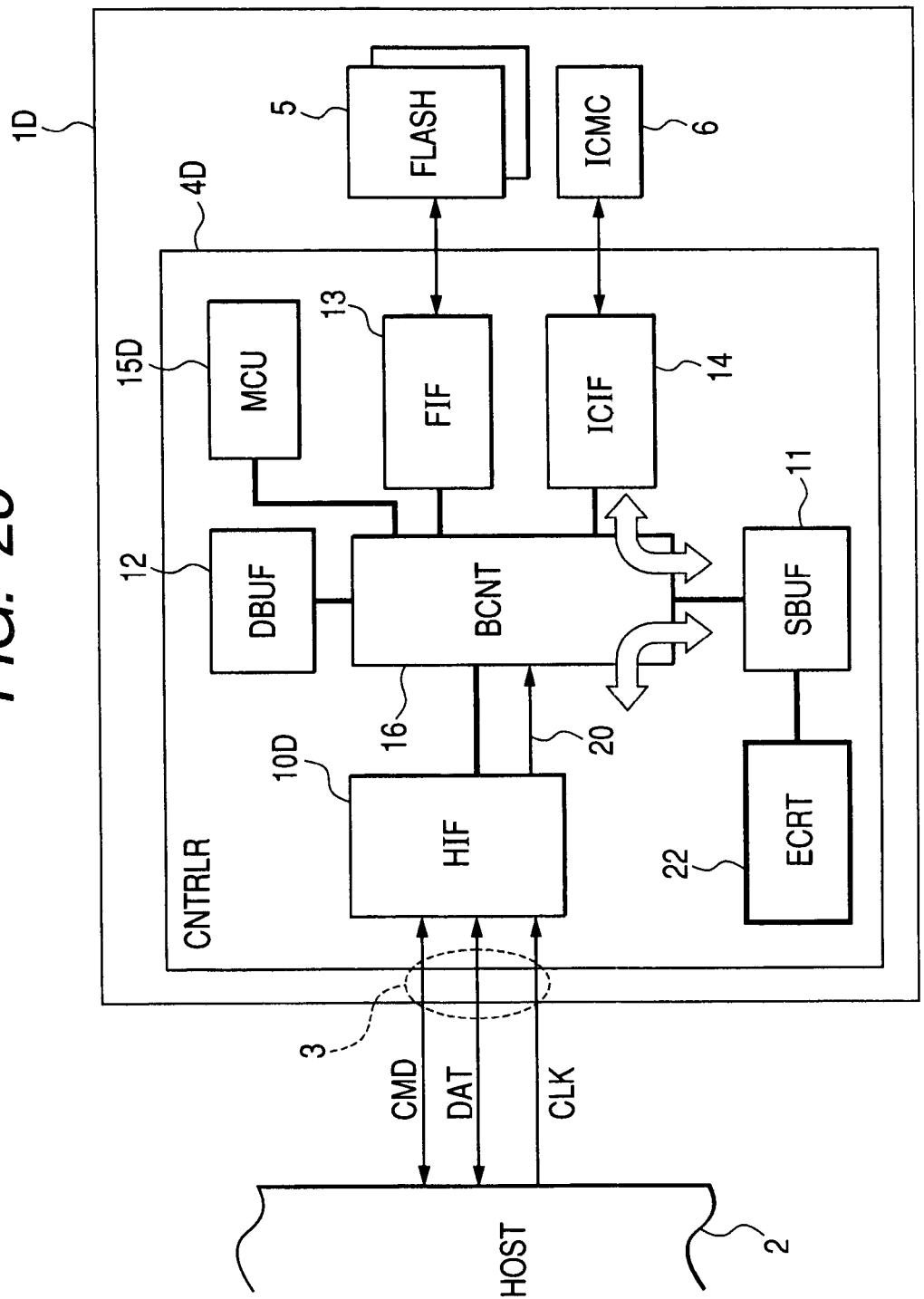
FIG. 26 is a block diagram of a memory card having an encryption operation unit in a controller chip.

FIG. 26 shows a memory card having an encryption operation unit in a controller chip. A memory card 1D shown in the drawing is different from the memory card of FIG. 1 in that it has a controller chip 4D including an encryption operation unit (ECRT) 22. The encryption operation unit 22 constitutes a first operation unit capable of decrypting encrypted data supplied to the host interface 10. Whether or not the data inputted from the data I/O terminal DAT is encrypted data is discerned based on the command inputted from the command terminal CMD. For example, a specified write secure command is accompanied by an encrypted IC card command. By recognizing the inputting of the specified write secure command mentioned above in response to an interrupt request from the host interface circuit, the microcomputer instructs the encryption operation unit 22 to perform a decryption process with respect to the encrypted data stored in the secure buffer 11. During the period of the decryption process, the buffer controller 16 is allowed to perform a control operation for accepting the standard memory card command supplied from the outside and using the data buffer 12. When the decryption by the encryption operation unit 22 is ended, the encryption operation unit 22 issues a request to interrupt the IC card command task to the microcomputer 15. This allows the decrypted IC card command to be transferred to the IC card chip 6. The encryption operation unit (ECRT) 22 is also applicable to the controller chip 4B of FIG. 6, though it is not particularly depicted.

Figure 27:
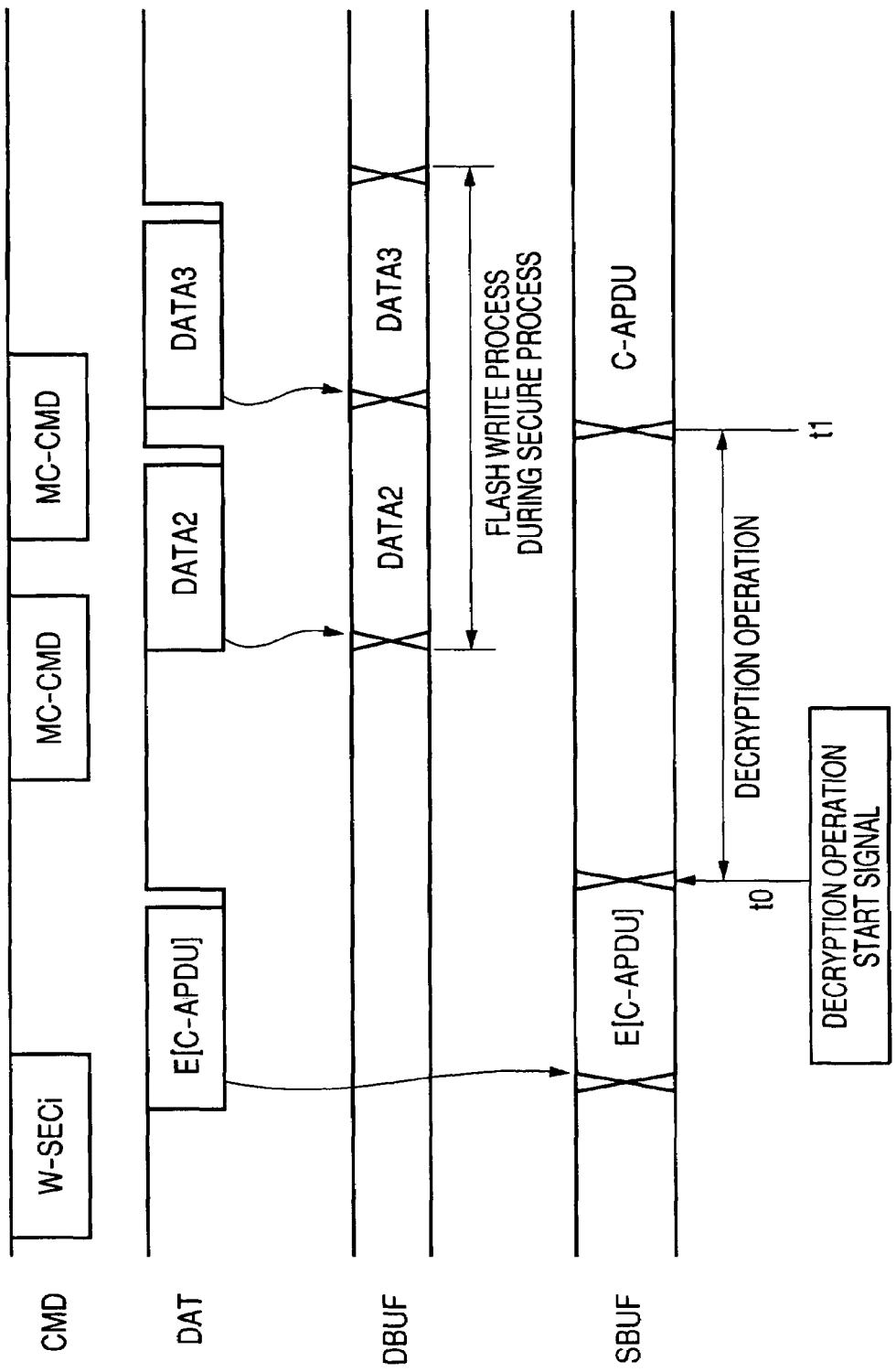
FIG. 27 is an operational timing chart when a flash write process is performed in parallel with a decryption process.

FIG. 27 illustrates an operational timing when a flash write process is performed in parallel with the decryption process. A specified write secure command W-SEC is inputted from the command terminal CMD and an encrypted IC card command E[C-APDU] is inputted from the data I/O terminal DAT. The encrypted IC card command E[C-APDU] is stored in the secure buffer 11 and then the encryption operation unit 22 is instructed to perform the decryption process with respect to the encrypted IC card command E[C-APDU] (time t0). When the standard memory card command (MC-CMD) is inputted to the command terminal CMD during the encryption operation and the write data DATA2 is inputted to the data I/O terminal DAT, the buffer controller 16 stores the data DATA2 in the data buffer 12 and issues a request to interrupt the process of the flash access memory card command task to the microcomputer 15. As a result, the encryption operation by the encryption operation unit 22 is performed in parallel with the writing of the data DATA2 in the flash memory chip 5 by the flash interface 13. When the decryption process is ended (time t1), the secure buffer 11 obtains the decrypted IC card command (C-APDU). For a specified read secure command for encrypting the IC card response and outputting the encrypted IC card response, the IC card response (R-APDU) stored in the secure buffer 11 is encrypted in the encryption operation unit 22 and the encrypted IC card response (E[R-APDU]) is outputted from the data I/O terminal DAT, though it is not particularly depicted.

Figure 28:
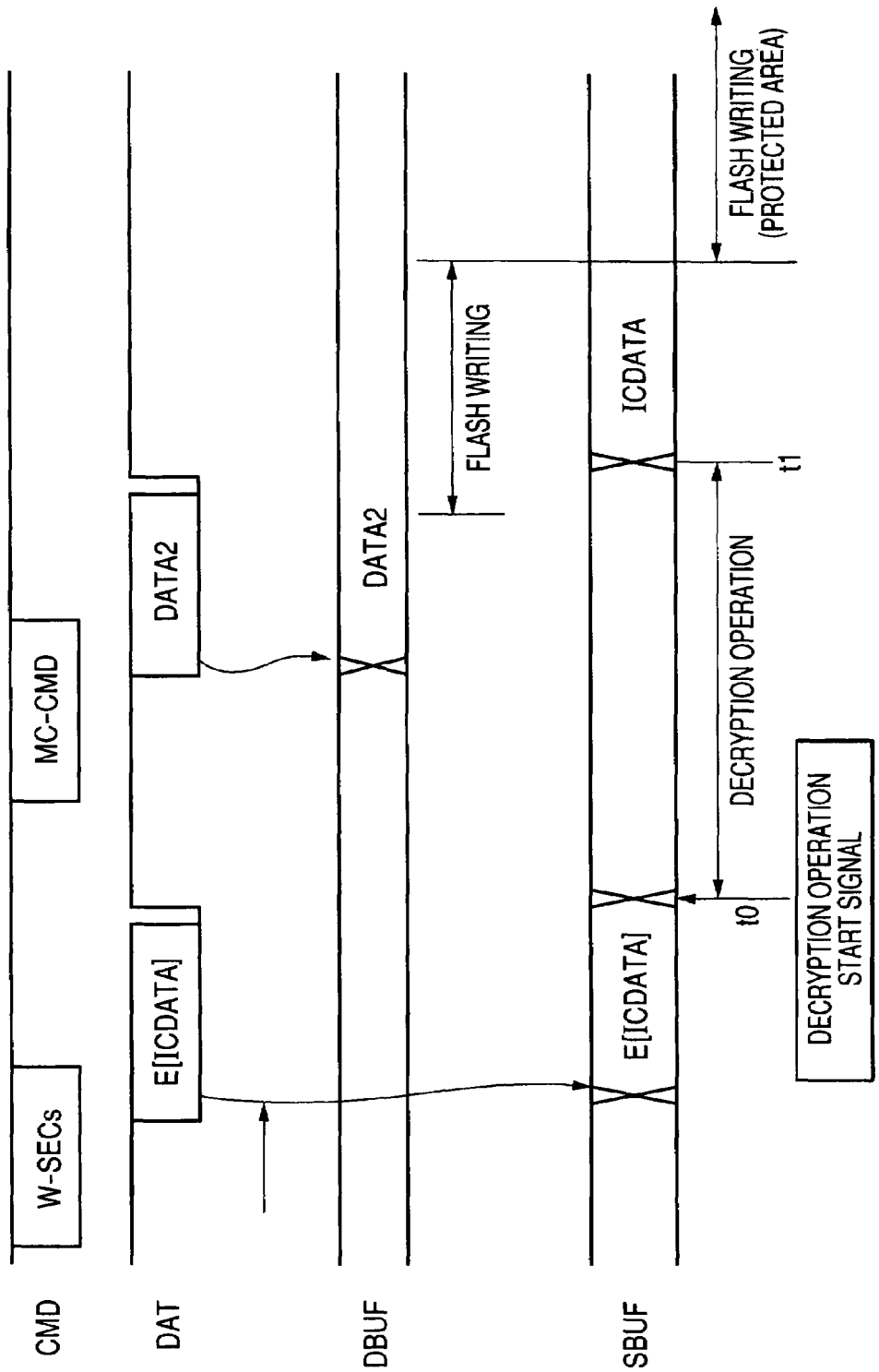
FIG. 28 is a timing chart for an operation of responding to a write secure command W-SECs which instructs an operation of writing encrypted data in the secure area of the flash memory chip.
Figure 29:
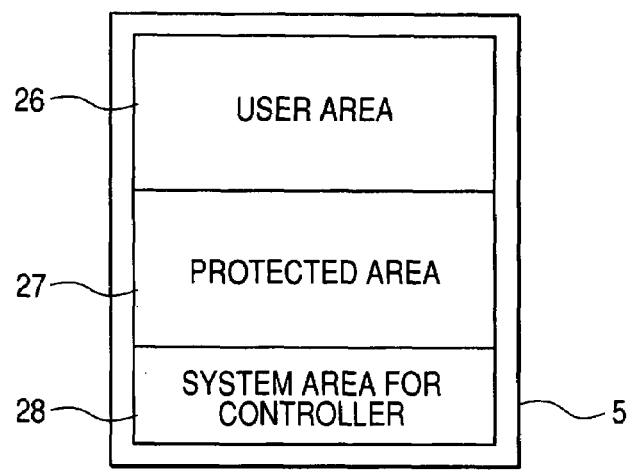
FIG. 29 is a view illustrating the memory areas of the flash memory chip.

FIG. 28 illustrates a timing for an operation of responding to the write secure command W-SECs which instructs an operation of writing the encrypted data in the secure area of the flash memory chip. The storage region of the flash memory chip 5 is divided into a user area 26, a protected area 27, and a system area 28 for controller as illustrated in, e.g., FIG. 29. The user area 26 is an area which can be rewritten in accordance with the standard memory card command. The protected area 27 is an area which includes authentication and can be rewritten in accordance with the secure command. The system area 22 for controller is an area which cannot be rewritten by the user and which can be rewritten by the manufacturer of the memory card.

A specified write secure command W-SECs is inputted from the command terminal CMD and encrypted secure data E[ICDATA] is inputted from the data I/O terminal DAT. The encrypted secure data E[ICDATA] is stored in the secure buffer 11 and then the microcomputer 15 instructs the encryption operation unit 22 to perform the decryption process with respect to the encrypted secure data E[ICDATA] (time t0). When the standard memory card command (MC-CMD) is inputted to the command terminal CMD during the decryption operation and the write data DATA2 is inputted to the data I/O terminal DAT, the buffer controller 16 stores the data DATA2 in the data buffer 12 and issues a request to interrupt the process of the flash access memory card command task to the microcomputer. As a result, the encryption operation by the encryption operation unit 22 is performed in parallel with the writing of the data DAT 2 in the flash memory chip 5 by the flash interface 13. When the decryption process is ended (time t1), the secure buffer 11 obtains the decrypted secure data (ICDATA). By the ending of the decryption operation, a request for the secure data to interrupt the process of the flash write task is issued to the microcomputer 15 so that the secure data ICDATA is written in the flash memory.

Figure 30:
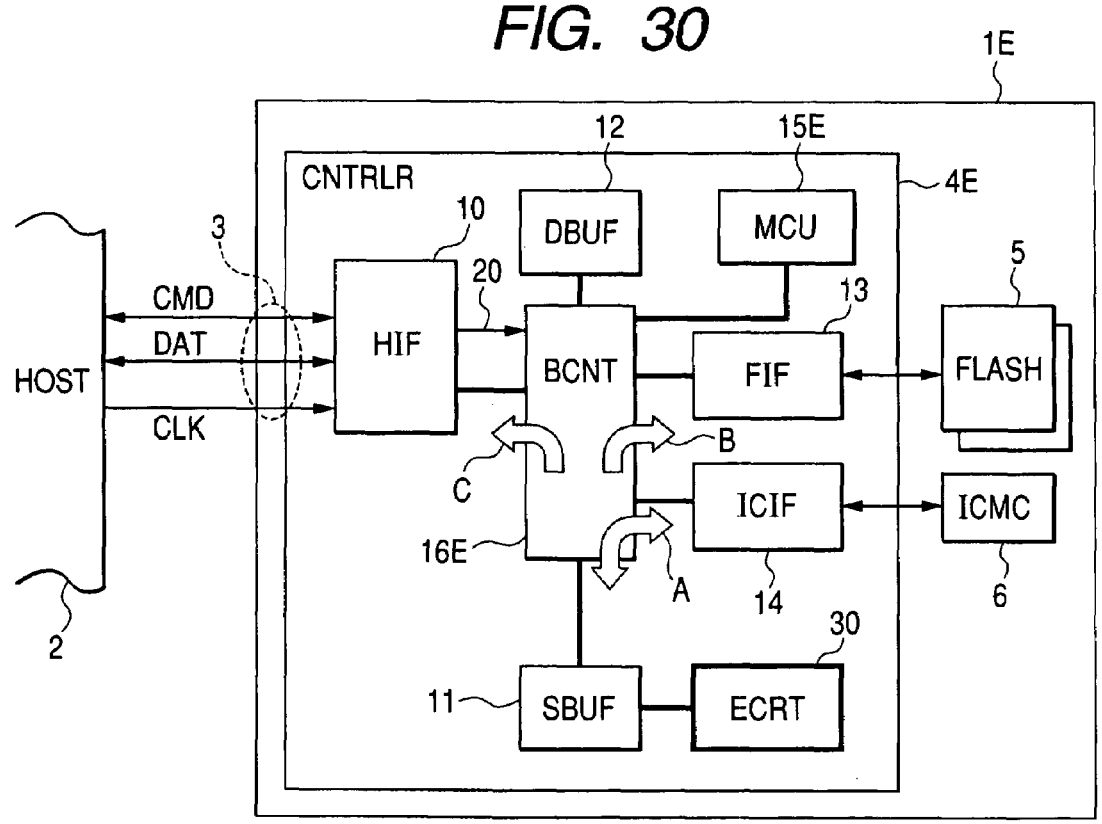
FIG. 30 is a block diagram of another memory card having an encryption operation unit in a controller chip.

FIG. 30 shows another memory card having an encryption operation unit provided in a controller chip. A memory card 1E shown in the drawing is different from the memory card shown in FIG. 1 in that it has a controller chip 4E comprising an encryption operation unit (ECRT) 30. The encryption operation unit 30 constitutes a second operation unit capable of decrypting encrypted data supplied from the IC card chip 6 to the secure buffer 11 and encrypting data to be transferred from the secure buffer 11 to the IC card chip 6. In the process of the IC card command task performed by the microcomputer in response to the write secure command (W-SEC), the IC card command stored in the secure buffer 11 is first encrypted by the encryption operation unit 30 and the resulting encrypted IC card command E[C-APDU] is transferred by the IC card interface to the IC card chip 6. The IC card chip decrypts the encrypted IC card command E[C-APDU] and executes it in the inside thereof. The IC card response R-APDU as the result of the execution is also encrypted inside the IC card chip 6. The IC card chip returns the encrypted IC card response E[R-APDU] to the IC card interface 14. The IC card interface 14 transfers the IC card response E[R-APDU] to the secure buffer 11. In response to the completion of the transfer, the microcomputer 15 causes the encryption operation unit 30 to decrypt the IC card response E[R-APDU] and determines whether or not the flash interoperation process described above is necessary based on the decrypted IC card response R-APDU. When it is necessary, the microcomputer 15 causes the encryption operation unit 30 to encrypt the secure data included in the IC card response R-APDU and controls a write operation to the flash memory chip 5 via the flash interface 13. When the flash interoperation process is not necessary, the decrypted IC card response is encrypted again by the encryption operation unit 30 with a required encryption intensity. The encrypted IC card response R-APDU is held in the secure buffer 11 and waits for a read instruction responding to the read secure command (R-SEC). In FIG. 30, the first encryption intensity of data supplied in each of the directions A and B need not necessarily be the same as the second encryption intensity of data to be supplied in the direction C. Since the encryption supplied in each of the directions A and B is used only inside the card, it is not even necessary to openly show the encryption system thereof and the like to the outside. When the first encryption intensity is assumed to be the DES (Data Encryption Standard), the second encryption intensity may be 3DES, which is triple the DES.

Figure 31:
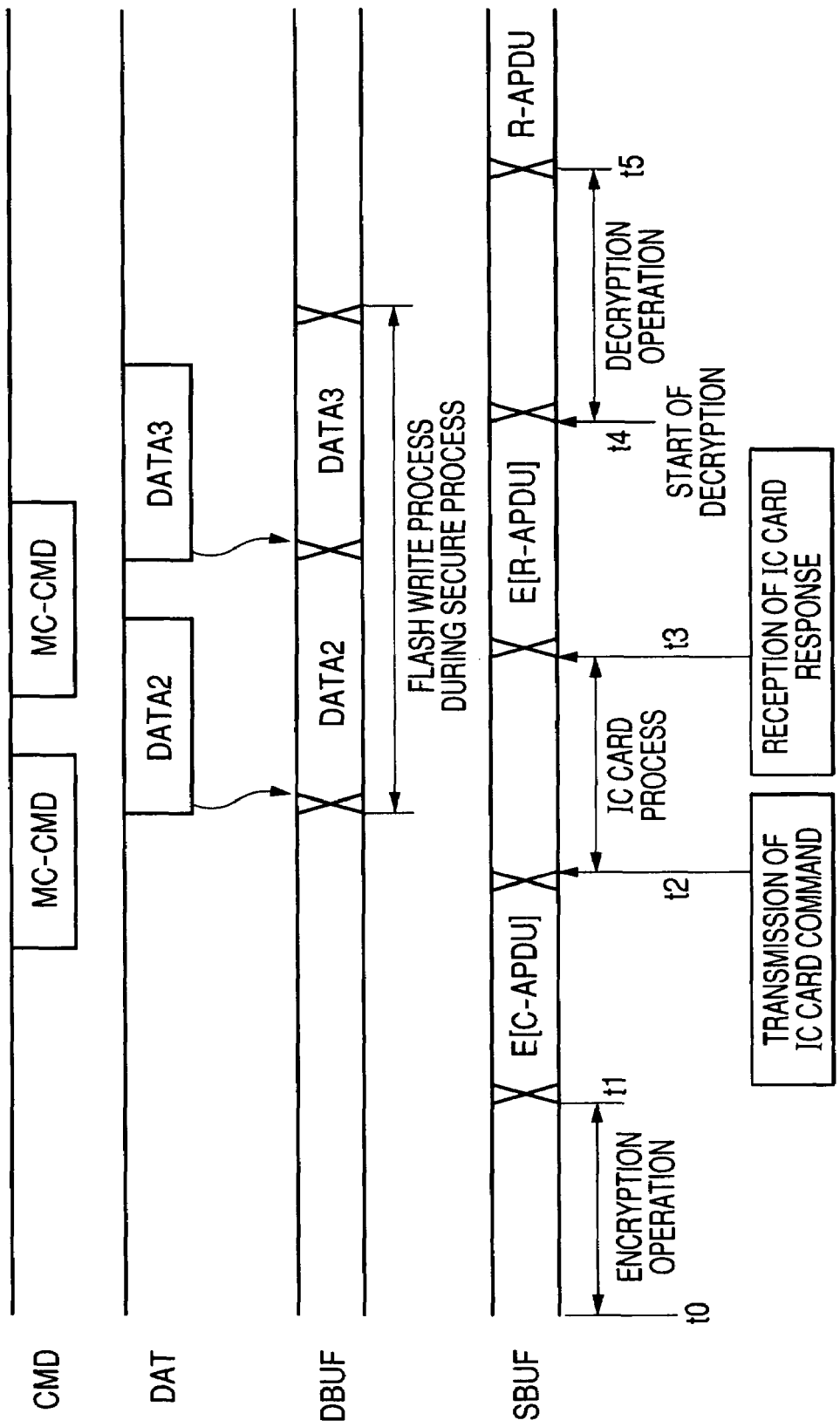
FIG. 31 is an operational timing chart for an operation of exchanging IC card data between an IC card chip and the secure buffer.

FIG. 31 illustrates a timing chart for IC card data between the IC card chip 6 and the secure buffer 11. In the process of the IC card command task performed by the microcomputer 15 in response to the write secure command (W-SEC), the IC card command stored in the secure buffer 11 is first encrypted by the encryption operation unit 30 during the period from the times t0 to t1 and the resulting encrypted IC card command E[C-APDU] is transferred completely by the IC card interface 14 to the IC card chip 6 (time t2). The IC card chip 6 decrypts the encrypted IC card command E[C-APDU] in the inside thereof and thereby completes the execution (time t3). The IC card response R-APDU as the result of the execution has also been encrypted inside the IC card chip 6. The IC card chip 6 transfers the encrypted IC card response E[R-APDU] to the IC card interface 14 (time t4). The IC card interface 14 stores the IC card response E[R-APDU] in the secure buffer 11 and the microcomputer 15 causes the encryption operation unit 30 to decrypt the IC card response E[R-APDU] in response to the completion of the storage (time t5).

In FIG. 31, during the period from the times t0 to t5, the secure buffer 11 and the IC card interface 14 are directly coupled to each other and the encryption operation unit 30 is also coupled to the secure buffer 11. As a result, a buffer controller 16E is allowed to input/output the standard memory card command and data from the external terminals CMD and DAT during the period of the encryption operation of the IC card command from the times t0 to 1, during the period of the transfer of the encrypted IC card command from the times t1 to t2, during the period of the IC card process from the times t2 to t3, during the period of the transfer of the encrypted IC card response transfer from the times t3 to t4, and during the period of the decryption of the encrypted IC card response from the times t4 to t5. In FIG. 31, e.g., the two standard memory card commands issued in succession are received and the write data sets DATA2 and DATA3 are inputted during the period from the time t0 to the time t5. The encryption operation unit (ECRT) is also applicable to the controller chip 4B of FIG. 6, though it is not particularly depicted.

By providing the encryption operation unit 30 described above, it becomes possible to improve the protection of the confidentiality of information transferred between the IC card chip 6 and the controller chip 4E. In addition, since the buffer controller 16E is allowed to receive the standard memory card even during the encryption/decryption process by the encryption operation unit, it is possible to eliminate the inconvenience of keeping the host device 2 waiting to issue a new command during the encryption/decryption process which requires time.

—Multiplexing—

Figure 32:
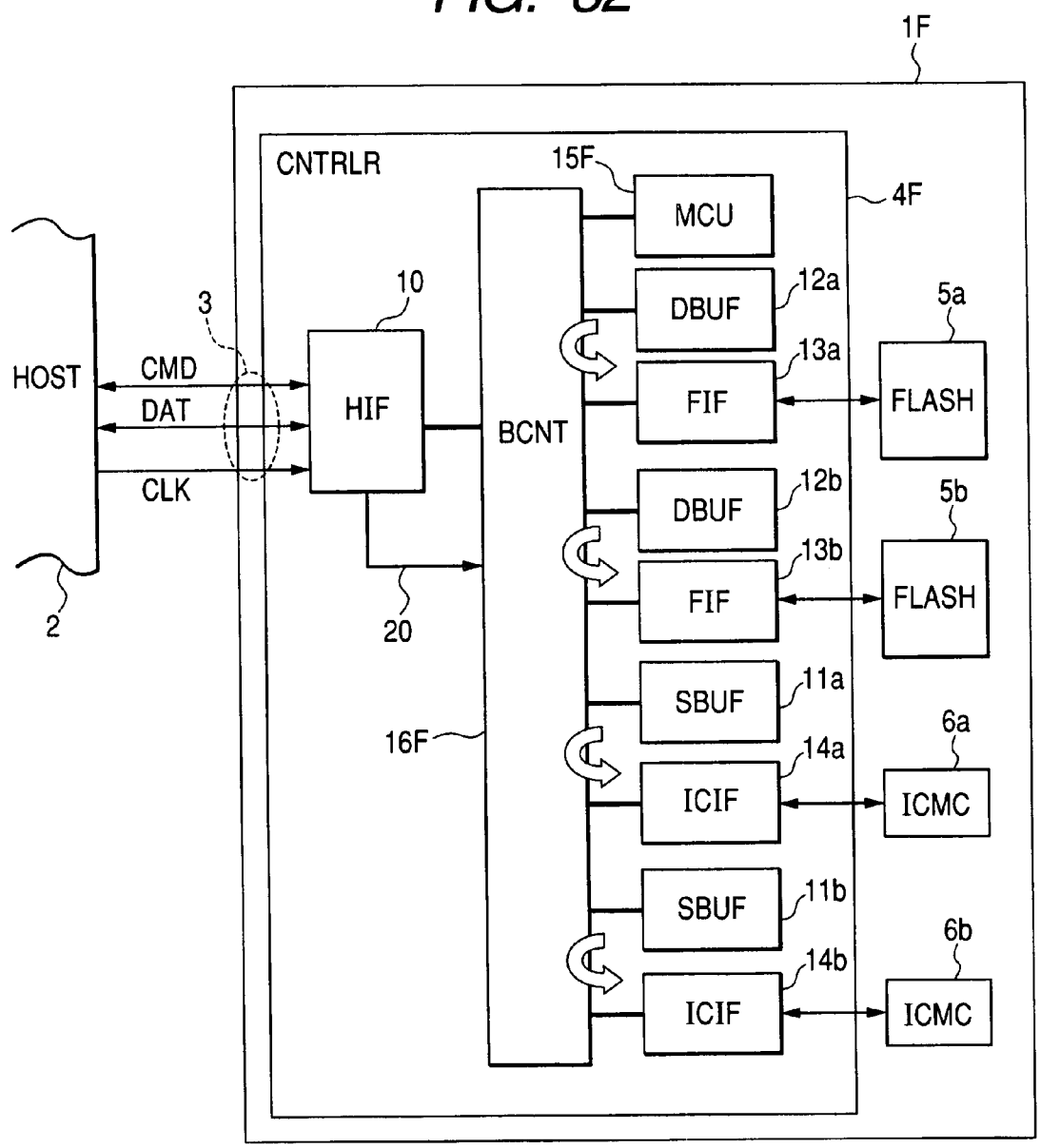
FIG. 32 is a block diagram illustrating a memory card on which plural memory chips and plural IC card chips are disposed.

FIG. 32 shows a memory card on which plural flash memory chips and plural IC card chip are disposed. The memory card has two flash memory chips 5a and 5b and two IC card chips 6a and 6b relative to a controller chip 4F. Correspondingly, the controller chip 4F has two data buffers 12a and 12b, two secure buffers 11a and 11b, two flash interfaces 13a and 13b, and two IC card interfaces 14a and 14b. The basic functions of the microcomputer 15 and the buffer controller 16F are the same as those in the memory card of FIG. 1. The configuration of bus connection for these circuit modules is the same as in the memory card of FIG. 1. When the microcomputer 15 responds to the write secure command, the secure buffer 11a, the IC card interface 14a, and the IC card chip 6a are connected in series. The same shall apply to the secure buffer 11b, the IC card interface 14b, and the IC card chip 6b. The memory card of FIG. 32 is the same as the memory cards described above in that it can receive another standard memory card during the IC card process but is greatly different from the memory cards described thus far in that it can receive another IC card command during the IC card process performed by one of the IC card chips and perform another IC card process in parallel by using the other IC card chip. Since commands are supplied individually from the specific secure buffers 11a and 11b to the plural IC card chips 6a and 6b, it is possible to perform, even during transfer between the controller chip 4F and one of the IC card chips, transfer with the other IC card chip. This allows more efficient transfer of the IC card command and the IC card response between the IC card chips and the controller chip 4F. Likewise, since there are also the two pairs of the flash memory chips 5a and 5b and the data buffers 12a and 12b, it becomes possible to perform, even during the transfer and writing of data into one of the flash memory chips, the transfer and writing of data into the other flash memory chip.

FIG. 33 illustrates an operational timing for parallel processing responding to plural write secure commands. Immediately after the IC card command C-APDU1 accompanying the first write secure command is stored completely in the secure buffer 11a, the data I/O terminal DAT is brought to the HIGH level so that the busy state is released and the subsequent write secure command is made receivable. Which one of the secure buffers 11a and 11b is to be used may be determined appropriately through the determination of an unoccupied state by the buffer controller 16F. Or, alternatively, when the write secure command specifies the IC card chip, the secure buffer corresponding to the specification may be selected appropriately by the buffer controller 16F.

FIG. 34 shows an operational timing for a process of writing secure data directly in the protected area 27 in accordance with a write secure command (direct secure command) which instructs direct writing to the protected area. In response to the write secure command W-SEC, the IC card chip performs the IC card process (times t0 to t2) and returns a decryption key as the IC card response (R-APDU) (time t3). During the IC card process, the buffer controller 16F receives a direct secure command W-SEC2 and stores encrypted data E[DATA] in the data buffer 12a. The microcomputer 15F responds to the returning of the decryption key as the IC card response (R-APDU) to the secure buffer 11a and causes an encryption operation unit not shown to decrypt the encrypted data E[DATA] in the data buffer 12a and instructs the flash interface 13 to perform a control operation for writing decrypted data DATA in the corresponding flash memory 5a. The encryption operation unit not shown is connected to the data buffer 12a and, even during the process of the decryption operation, the buffer controller 16F is allowed to receive another command and process it. Even when the standard memory card command MC-CMD is issued at the time t1, it is received so that the data DATA1 is stored in the data memory buffer 12b and the writing of the data DATA1 in the flash memory 5b is permitted in parallel with the process of writing the decrypted data DATA described above in the flash memory 5a.

Thus, in parallel with the authentication by the IC card chip and the process of writing the secure data in the flash memory based on the authentication, it becomes possible to perform the writing of non-secure data in another flash memory. This allows a contribution to an increase in the speed of a complicated flash access process.

Although the invention achieved by the present inventors has thus been described specifically with reference to the embodiments thereof, the present invention is not limited thereto. It will be easily appreciated that various changes and modifications can be made in the invention without departing from the gist thereof.

For example, the specifications of the external interfaces of the memory card are not limited to those conforming to the MMC standard and may also conform to another memory card standard. Accordingly, the command code, command format, data communication protocols thereof can be variously changed in accordance with the card standard. The controller chip and the flash memory may also be provided on the same chip. The IC card chip is an example of the data processor and is not limited to a microcomputer for IC card.

What is claimed is:

1. A memory card comprising:
   a rewritable, nonvolatile memory;
   a plurality of external interface terminals capable of receiving a first command for a security processing and a second command with data for accessing the rewritable nonvolatile memory;
   an interface controller coupled to the plurality of external interface terminals and including:
   a first buffer to store the first command,
   a second buffer to store the data relating to the second command, and
   a microcomputer to execute the second command so as to access the rewritable nonvolatile memory based on the second command; and
   a data processor connected to said for a security processing coupled to the interface controller and including:
   a CPU to execute the first command so as to execute a security processing based on the first command,
   wherein
   the interface controller inputs the first command supplied from an outside of the memory card to the first buffer, after the completion of the input of the first command to the first buffer, transfers the first command to the CPU in the data processor, and, while causing a process based on the first command to be performed in the CPU in the data processor, allows data corresponding to the second command supplied from the outside of the memory card and related to access to the nonvolatile memory to be input to the second buffer.

2. A memory card according to claim 1,
   wherein
   the interface controller uses the first and second buffers to interface with the outside via the plurality of external interface terminals.

3. A memory card according to claim 2,
   wherein
   the interface controller allows a control operation for storing the data in the second buffer in response to the second command supplied from the outside of the memory card and writing the stored data from the second buffer in the nonvolatile memory during a period from when the first command supplied from the outside of the memory card is completely stored in the first buffer to when the security processing based on the first command supplied to the CPU in the data processor is ended.

4. A memory card according to claim 3,
   wherein
   the interface controller allows a control operation for storing the data read from the nonvolatile memory in response to a third command supplied from the outside of the memory card in the second buffer and outputting the stored data from the second buffer to the outside of the memory card during the period from when the first command supplied from the outside of the memory card is completely stored in the first buffer to when the security processing based on the first command supplied to the CPU in the data processor is ended.

5. A memory card according to claim 1,
   wherein
   the interface controller uses the second buffer to interface with the outside of the memory card via the plurality of external interface terminals, transfers the first command from the outside of the memory card, the first command being used by the CPU in the data processor, from the second buffer to the first buffer, and transfers a result of the security processing performed by the data processor from the first buffer to the second buffer.

6. A memory card according to claim 5,
   wherein
   the interface controller allows a signal indicative of an internal busy state to be outputted to the outside and releases the internal busy state in synchronization with a timing with which the first command from the outside, the first command being used by the CPU in the data processor, is transferred completely from the first buffer to the second buffer.

7. A memory card according to claim 6,
   wherein
   the interface controller allows a control operation for storing the data in the second buffer in response to the other command supplied from the outside of the memory card and writing the stored data from the second buffer in the nonvolatile memory during a period from when the first command supplied from the outside is stored in the second buffer and completely transferred to the first buffer to when the security processing based on the first command supplied to the CPU in the data processor is ended.

8. A memory card according to claim 7,
   wherein
   the interface controller allows a control operation for storing the data read from the nonvolatile memory in response to still another command supplied from the outside of the memory card in the second buffer and outputting the stored data from the second buffer to the outside of the memory card during the period from when the first command supplied from the outside is stored in the second buffer and completely transferred to the first buffer to when the security processing based on the first command supplied to the CPU in the data processor is ended.

9. A memory card according to claim 5,
   wherein
   when a result of the security processing in accordance with the first command includes an instruction to access the nonvolatile memory and when an access request for transferring the result of the data process related to the access instruction from the first buffer to the second buffer competes with an access request corresponding to an instruction to access the nonvolatile memory in accordance with another command, the interface controller preferentially accepts the access request corresponding to the access instruction in accordance with the another command.

10. A memory card according to claim 1,
    wherein
    each of the first and second buffers is a predetermined specific buffer.

11. A memory card according to claim 1,
wherein
the first buffer and the second buffer are interchangeable buffers, and
wherein
the interface controller has a flag indicative of the allocation to the first buffer and a flag indicative of the allocation to the second buffer.

12. A memory card according to claim 1,
wherein
the interface controller further comprises a host interface,
wherein
the host interface gives an interrupt request to the microcomputer in response to the inputting of the first or second command,
wherein
the microcomputer executes an interrupt process corresponding to a type of the first or second command in response to the interrupt request, and
wherein
when the inputted command is accompanied by the first command, the microcomputer instructs data processor to execute the first command and performs a control operation for shifting itself into a low-power-consumption state under the condition that there is not another interrupt request during the execution of the first command, and the data processor re-shifts from the low-power-consumption state of the microcomputer in synchronization with a timing with which the execution of the first command is ended.

13. A memory card according to claim 1,
wherein
when a result of the security processing in accordance with the first command includes an instruction to access the nonvolatile memory and when an access request based on the access instruction competes with an access request corresponding to an instruction to access the nonvolatile memory in accordance with another command, the interface controller mediates between the two access requests and gives an access right to either of the two access requests depending on which one of the two access requests is issued earlier.

14. A memory card according to claim 1,
wherein
when a result of the data process security processing in accordance with the first command includes an instruction to access the nonvolatile memory and when an access request based on the access instruction competes with an access request corresponding to an instruction to access the nonvolatile memory in accordance with another command, the interface controller mediates between the two access requests and gives an access right preferentially to the access request corresponding to the access instruction in accordance with the another command.

15. A memory card according to claim 1,
wherein
the interface controller further comprises a first operation unit capable of decrypting encrypted data supplied from the outside of the memory card to the first buffer, and
wherein
the interface controller is capable of controlling an operation of using the second buffer based on a command supplied from the outside of the memory card in parallel with an operation of decrypting the encrypted data supplied from the outside of the memory card to the first buffer by using the first operation unit.

16. A memory card according to claim 1,
wherein
the interface controller further comprises a second operation unit capable of decrypting encrypted data supplied from the data processor to the first buffer or encrypting data to be transferred from the first buffer to the data processor, and
wherein
the interface controller is capable of controlling an operation of using the second buffer based on a command supplied from the outside in parallel with an operation of performing decryption or encryption by using the second operation unit.

17. A memory card according to claim 1,
wherein
the nonvolatile memory includes a plurality of nonvolatile memories,
wherein
the data processor includes a plurality of data processors,
wherein
the first buffer of the interface controller includes a plurality of first buffers, and
wherein
the second buffer of the interface controller includes a plurality of second buffers.

18. A memory card according to claim 1, wherein said data processor is a microcomputer for an IC card.

19. A memory card according to claim 18,
wherein
the interface controller, the nonvolatile memory, and the data processor are individual semiconductor integrated circuits formed in semiconductor chips distinct from each other.

20. A memory card comprising:
a plurality of memory card interface terminals;
an interface controller chip coupled to each of the plurality of memory card interface terminals and including a microcomputer, a first buffer and a second buffer;
a rewritable nonvolatile memory chip coupled to the interface controller chip; and
a data processor chip for a security processing coupled to the interface controller chip and including a CPU,
wherein
the interface controller chip performs, while operating the data processor chip by giving data for control accompanying a specified command supplied from an outside of the memory card, an operation based on another command supplied from the outside of the memory card in parallel therewith, and
wherein
the interface controller chip after completely inputting data for control supplied from the outside of the memory card to the first buffer, allows data related to the other command supplied from the outside of the memory card to be input to the second buffer.

21. A memory card comprising:
a plurality of memory card interface terminals;
an interface controller chip coupled to each of the plurality of memory card interface terminals and including a microcomputer, a first buffer and a second buffer;
a rewritable nonvolatile memory chip coupled to the interface controller chip; and
a data processor chip for a security processing coupled to the interface controller chip and including a CPU,
wherein
the interface controller chip is capable of performing, while operating the data processor chip by giving data for control accompanying a specified command supplied from an outside of the memory card, an operation based on another command supplied from the outside of the memory card in parallel therewith, and wherein the interface controller chip, uses the second buffer for communication with the outside of the memory card, and, after completely inputting the data for control to the second buffer and completely transferring the data for control to the first buffer, allows data related to the other command supplied from the outside of the memory card to be input to the second buffer.

* * * * *